United States Patent [19]
Lee et al.

[11] Patent Number: 6,114,287
[45] Date of Patent: Sep. 5, 2000

[54] METHOD OF DEFORMING A BIAXIALLY TEXTURED BUFFER LAYER ON A TEXTURED METALLIC SUBSTRATE AND ARTICLES THEREFROM

[75] Inventors: Dominic F. Lee; Donald M. Kroeger; Amit Goyal, all of Knoxville, Tenn.

[73] Assignee: UT-Battelle, LLC, Oakridge, Tenn.

[21] Appl. No.: 09/163,994

[22] Filed: Sep. 30, 1998

[51] Int. Cl.$^7$ .................................................. C30B 29/22
[52] U.S. Cl. ........................ 505/473; 505/474; 505/236; 117/95; 117/101; 117/106; 117/947
[58] Field of Search .................................. 505/473, 236, 505/474; 107/94, 15, 101, 106, 947

[56] References Cited

U.S. PATENT DOCUMENTS

| | | | |
|---|---|---|---|
| 3,770,497 | 11/1973 | Hassler te al. | |
| 5,212,148 | 5/1993 | Roas et al. | 505/1 |
| 5,248,662 | 9/1993 | Yoshida et al. | 505/1 |
| 5,290,761 | 3/1994 | KEating et al. | 505/1 |
| 5,312,804 | 5/1994 | PEtitbon et al. | 505/434 |
| 5,372,089 | 12/1994 | Yoshida et al. | 117/98 |
| 5,432,151 | 7/1995 | Russo et al. | 505/474 |
| 5,739,086 | 4/1998 | Goyal et al. | 505/473 |

FOREIGN PATENT DOCUMENTS

| | | |
|---|---|---|
| 697916 | 11/1964 | Canada ................. 75/122 |
| 62-1100-818 | 10/1987 | Japan . |
| 62-1100-820 | 10/1987 | Japan . |
| 6-139848 | 5/1994 | Japan . |

OTHER PUBLICATIONS

M. Paranphaman et al., "Growth of Biaxially Textured Buffered Layers on Rolled Ni Substrates by Electron Beam Evaporation", *Physica C.*, 275, 266 (1997).

R.P. Reade et al., "Laser Deposition of Biaxially Textured Yttria–stabilized Zirconia Buffer Layers on Polycrystalline Metallic Alloys for High Critical Current Y–Ba–Cu–O Thin Films", *Applied Physical Letters*, 61, 2231–233 (1992).

D. Dimos et al., "Orientation Dependence of Grain–Boundary Critical Currents in $Yba_2Cu_3O_{7-\varsigma}$ Bicrystals", *Physical Review Letters*, vol. 61, No. 2 (Jul. 11, 1988).

D. Dimos et al., "Superconducting Transport Properties of Grain Boundaries in $Yba_2Cu_3O_7$ Bicrystals", *Physical Review B*, 41, 4038 (1990).

Y. Iijima, et al., "Structural and Transport Properties of Biaxially Aligned $YBa_2Cu_3O_{7-x}$ Films on Polycrystaline Ni–Based Alloy with Ion–Beam Modified Buffer Layers", *Journal of Applied Physics*, 74, 1905 (1993).

A. Ginsbache et al., "Growth of C–Axis Oriented YbaCuO Films on Oxidized Textured Ni Sheets and on (100) and (110) Oriented NiO Single Crystals", *IEEE Treansactions on Magnetics*, vol. 27, 1410 (1991).

K. Sato, et al., "High–$J_c$ Silver–Sheathed Bi–Based Superconducting Wires", *IEEE Transactions on Magnetics*, 27 (1991) 1231.

K. Heine, et al., "High–Field Critical Current Densities in $BI_2Sr_2CA_1Cu_2O_8$+x/Ag Wires", *Applied Physics Letters*, 55 (1991) 2441.

(List continued on next page.)

*Primary Examiner*—Robert Kunemund
*Attorney, Agent, or Firm*—Quarles & Brady LLP

[57] ABSTRACT

The present invention provides methods and biaxially textured articles having a deformed epitaxial layer formed therefrom for use with high temperature superconductors, photovoltaic, ferroelectric, or optical devices. A buffer layer is epitaxially deposited onto biaxially-textured substrates and then mechanically deformed. The deformation process minimizes or eliminates grooves, or other irregularities, formed on the buffer layer while maintaining the biaxial texture of the buffer layer. Advantageously, the biaxial texture of the buffer layer is not altered during subsequent heat treatments of the deformed buffer. The present invention provides mechanical densification procedures which can be incorporated into the processing of superconducting films through the powder deposit or precursor approaches without incurring unfavorable high-angle grain boundaries.

28 Claims, 24 Drawing Sheets

OTHER PUBLICATIONS

R. Flukiger, et al., "High Critical Current Densities in Bi(2223)/Ag Tapes", *Superconductor Science & Technology,* 5 (1992) S61.

D. Dijkkamp, et al., "Preparation of Y–Ba–Cu Oxide Superconducting Thin Films Using Pulsed Laser Evaporation from High Te Bulk Materials", *Applied Physics Letters,* 51, 619 (1987).

S. Mahajan, et al., "Effects of Target and Template Layer on the Properties of Highly Crystalline Superconducting a–Axis Films of $YBa_2$–$Cu_3$–$O_7$ by DC–Spuuering", *Physica C.,* 213, 445 (1993).

A. Inam, et al., "A–axis Oriented Epitaxial $YBa_2$–$Cu_3$–$O_7$–$PrBa_2Cu_3O_7$ Heterostructures", *Applied Physics Letters,* 57, 2484 (1990).

R.E. Russo, et al., "Metal Buffer Layers and Y–Ba–Cu–O Thin Films on Pt and Stainless Steel Using Pulsed Laser Deposition", *Journal of Applied Physics,* 68, 1354 (1990).

E. Narumi, et al., "Superconducting $YBa_2Cu_3O_{6.8}$ Films on Metallic Substrates Using In Situ Laser Deposition", *Applied Physics Letters,* 56, 2684 (1990).

J.D. Budai, et al,"In–Plane Epitaxial Alignment of $YBa2$–$Cu_3$–$O_{7-x}$ Films Grown on Silver Crystals and Buffer Layers", *Applied Physics Letters,* 62, 1836 (1993).

T.J. Doi, et al., "A New Type of Superconducting Wire; Biaxially Oriented $Tl_1(Ba_{0.8}Sr_{0.2})_2Ca_2Cu_3O_9$ on [100]<100> Textured Silver Tape", Proceedings of 7th International Symposium on Superconductivity, Fukuoka, Japan, Nov. 8–11, 1994.

D. Forbes, Executive Editor, "Hitachi Reports 1–meter Tl–1223 Tape Made by Spray Pyrolysi", *Superconductor Week,* vol. 9, No. 8, Mar. 6, 1995.

*Recrystallization Grain Growth and Textures,* Papers presented at a seminar of the American Society for Metals, Oct. 16 and 17, 1965, American Society for Metals, Metals Park, Ohio.

A. Goyal et al., "High Critical Current Density Superconducting Tapes by Epitaxial of $YBa_2Cu_3Ox$ Thick Films on Biaxially Textured Metal Substrates", *Appl. Phy. Lett.,* 69, 1795 (1996).

D. P. Norton et al., "Epitaxial $YBa_2Cu_3O_x$ on Biaxially Textured Biaxially Textured (001) Ni: An approach to High Critical Current Density Superconducting Tape", *Science,* 274, 755 (1996).

Goyal et al., "High Current Density $YBa_2Cu_3O_x$ Tapes Using RABiTs Approach", J. Superconductor vol., 11(5) pp 481—487, 1998.

Sample 040798 (Ag/Pd/CeO2/Ni)

Ag(220) Pole Figure

Rolled From Initial Sample Thickness of 150 microns
Down to Final Thickness of 141.5 microns Sample 120997 (Ag/Pd/CeO2/Ni)
Ag(111) Pole Figure
Annealed at 825 deg C for 2h in 7.5% Oxygen after Pressing

METHOD OF DEFORMING A BIAXIALLY TEXTURED BUFFER LAYER ON A TEXTURED METALLIC SUBSTRATE AND ARTICLES THEREFROM

This invention was made with government support under contract DE-ACO5-96OR22464, awarded by the United States Department of Energy to Lockheed Martin Energy Research Corporation, and the United States Government has certain rights in this invention.

FIELD OF THE INVENTION

The present invention is related to biaxially textured metallic substrates and articles made therefrom, and more particularly to methods of forming substrates and articles having a biaxial texture.

BACKGROUND OF THE INVENTION

Since the discovery of superconducting materials having critical temperatures that exceed the temperature of liquid nitrogen, there has been a concerted effort to utilize these materials for various applications, such as in wires and electronic devices. In order to be commercially viable, these applications require high temperature superconducting materials with large critical current density. Critical current density, $J_c$, is the maximum current density a superconductor can carry at a given temperature and magnetic field. One such high temperature superconducting (HTS) material is a composite oxide of RE, Ba and Cu, (ReBCO) and in particular, $REBa_2Cu_3O_x$ (wherein RE represents at least one of the following rare earth elements: Y, La, Sm, Nd, Eu, Gd, Dy, Ho, Er, Tm, Yb, or Lu).

Current materials research aimed at fabricating high temperature superconducting ceramics in conductor configurations for bulk, practical applications, is largely focused on powder-in-tube methods. Such methods have proven quite successful for the Bi—(Pb)—Sr—Ca—Cu—O (BSCCO) family of superconductors due to their unique mica-like mechanical deformation characteristics. In high magnetic fields, however, this family of superconductors is generally limited to applications below 30° K. In the ReBCO Tl—(Pb, Bi)—Sr—(Ba)—Ca—Cu—O and Hg—(Pb)—Sr—(Ba)—Ca—Cu—O families of superconductors, some of the compounds have much higher intrinsic limits and can be used at higher temperatures.

It has been demonstrated that these superconductors possess a high $J_c$ at high temperatures when fabricated as single crystals or in essentially single-crystal form as epitaxial films on single crystal substrates such as $SrTiO_3$ and $LaAlO_3$. An epitaxial film is one whose crystalline lattice is nearly perfectly aligned with the lattice of the substrate on which it is deposited. These superconductors have so far been intractable to conventional ceramics and materials processing techniques to form long lengths of a polycrystalline conductor with a $J_c$ comparable to epitaxial films. This is primarily because the poor electrical connections at the boundaries between crystalline grains, which is known in they art as the "weak-link" effect.

Thin-film materials having perovskite-like structures are important in superconductivity, ferroelectrics, and electro-optics. Many applications using these materials require, or would be significantly improved by single crystal, c-axis oriented perovskite-like films grown on single-crystal or highly aligned metal or metal-coated substrates. For instance, $Y—Ba_2—Cu_3—O$ (YBCO) is an important superconducting material for the development of superconducting current leads, transmission lines, motor and magnetic windings, and other electrical conductor applications. When cooled below their transition temperature, superconducting materials have no electrical resistance and carry electrical current without energy dissipation.

One technique for fabricating a superconducting wire or tape is to deposit a YBCO film on a metallic substrate. Superconducting YBCO has been deposited on polycrystalline metals in which the YBCO is c-axis oriented, but not aligned in-plane. To carry high electrical currents, however, the YBCO films must be biaxially textured, preferably c-axis oriented, with effectively no large-angle grain boundaries, since such grain boundaries are detrimental to the current-carrying capability of the material. YBCO films deposited on polycrystalline metal substrates do not generally meet this criterion.

Many electronic, magnetic, or superconductor device applications require control of the grain boundary character of the device materials. For example, grain boundary character is very important in high temperature superconductors. It is known that the critical current density through a grain boundary may be reduced significantly for misorientation angles greater than 5°–10°. It is thus desirable to obtain superconducting deposits in which the number of grain boundaries with misorientation angles greater than 5°–10° is minimized. For conductors in which the superconducting deposit is epitaxial with an underlying metallic or oxide buffer layer or substrate, it is desirable to minimize the number of grain boundaries with misorientations greater than 5°–10°. This is accomplished if the texture of the substrate has grain orientations which vary by no more than 5°–10°. Useful superconducting layers may be obtained using substrates with a larger spread in grain orientation. However, the properties of the superconductor deposit are expected to improve with a biaxially textured substrate having a narrow spread in grain orientation.

The effects of grain boundary characteristics on current transmission have been clearly demonstrated for certain materials, for example, the material known as YBCO. See Dimos, et al. (1988) Phys. Rev. Lett. 61:219; and Dimos, et al. (1990) Phys. Rev. Lett. 41:4038. For clean, stoichiometric boundaries, the grain boundary critical current ($J_c(gb)$) appears to be determined primarily by grain boundary misorientation. The dependence of $J_c(gb)$ on misorientation angles for YBCO has been determined by Dimos et al. for grain boundary types which can be formed in epitaxial films on bicrystal substrates. These include [001] tilt, [100] tilt, and [100] twist boundaries. In each case, however, high angle boundaries were found to be weak-linked.

Recently, the Dimos work has been extended to artificially fabricated [001] tilt bicrystals in $Tl_2Ba_2CaCu_2O_8$ (A. H. Cardona, et al., Appl. Phys. Lett., 62 (4), 411, 1993)), $NdI_{0.85}Ce_{0.15}CuO_4$, $Tl_2Ba_2Ca_2Cu_3O_x$ (M. Kawasaki, et al., Appl. Phys. Lett., 62(4), 417 (1993)), and $TlBa_2Ca_2Cu_2O_x$ (T. Nabatame, et al., Appl. Phys. Lett. 65 (6), 776 (1994)). In each of these cases, it was found that, as in the case of YBCO, $J_c$ depends strongly on grain boundary misorientation angle. Although no measurements have been made on the material known as Bi-2223, data on current transmission across artificially fabricated grain boundaries in the material termed Bi-2212 indicate that most large angle [001] tilt (M. Kawasaki, et al., Appl. Phys. Lett., 62 (4), 417 (1993)) and twist boundaries are weak links, with the exception of some coincident site lattice (CSL) related boundaries (N. Tomita, et al., Jpn. J. Appl. Phys., 29 (1990) L30; N. Tomita, et al., Jpn. J. Appl. Phys., 31, L942 (1992); J. L. Wang, et al., Physica C, 230, 189 (1994)). It is likely that the variation in $J_c$ with [100] tilt grain boundary misorientation in materials Bi-2212 and Bi-2223 is similar to that observed in the well characterized cases of YBCO and Tl-based superconductors.

Hence, in order to fabricate high temperature superconductors with a high $J_c$, it is necessary to have good biaxial texture. This has been shown to result in significant improvement in the superconducting properties of YBCO films (Y. Iijima, et al., Appl. Phys., 74,1905 (1993); R. P. Reade et. al., Appl. Phys. Lett., 61, 2231 (1992); X. D. Wu, et al., Appl. Phys. Lett., 65, 1961 (1994).

Methods have been developed to biaxally texture ReBCO to obtain a high $J_c$. High $J_c$'s have been reported in polycrystalline ReBCO in thin films deposited in special substrates on which a biaxially textured non-superconducting oxide buffer layer is first deposited using ion-beam assisted deposition (IBAD) techniques. High $J_c$'s have also been reported in polycrystalline ReBCO melt-processed bulk material which contains primarily small angle grain boundaries.

Recent developments in biaxially textured metallic substrates such as Rolling Assisted Biaxially Textured Substrates (RABiTS), such as described in U.S. Pat. Nos. 5,739,086 and 5,741,377, which are fully incorporated by reference herein, and IBAD on Hastelloy have enabled the fabrication of high $J_c$ high temperature superconductors (HTS) including $YBa_2Cu_3O_x$ and (Tl, Bi)-1223.

In the RABiTS process, metallic tapes are obtained from deformation processes such as rolling. These tapes are then annealed at elevated temperatures to enable the development of biaxially aligned cube texture. During the annealing process, however, surface irregularities, such as thermal grooves as shown in FIG. 1, appear and are frequently retained through subsequent buffers and HTS deposition. The presence of these irregularities in the HTS film reduces the current carrying ability of the superconductor. Therefore, it is highly desirable to eliminate, or at least minimize, these irregularities so as to achieve a more reproducible and useful superconductor performance.

In addition to the problems associated with surface irregularities, another drawback that is common to biaxially textured substrates, including those formed using RABiTS and IBAD processes, is the brittle nature of the ceramic buffer layers. These buffers serve as diffusion barriers as well as transitional layers to obtain final HTS epitaxy. To date, high $J_c$ HTS films have been deposited onto these textured substrates only by vapor deposition methods.

For large scale manufacturing, it is highly desirable to deposit the HTS by alternative means such as powder deposition and solution precursor prior to high temperature HTS formation treatments in an oxidizing atmosphere. However, these large scale manufacturing methods require densification of the precursor prior to the HTS formation treatments. Due to the brittle nature of the ceramic buffers, cracks will be initiated and will propagate within the buffers. Discontinuities, such as cracks, will permit the diffusion of undesirable elements into the HTS as well as the formation of rough metallic oxides, such as shown in FIG. 2, thereby severely degrading the superconducting properties of the coated conductor.

For further background information, refer to the following publications:

1. K. Sato, et al., "High-$J_c$ Silver-Sheathed Bi-Based Superconducting Wires", JEFE Transactions on Magnetics, 27 (1991) 1231.
2. K. Heine, et al., "High-Field Critical Current Densities in $BI_2Sr_2Ca_1Cu_2O_8$+x/Ag Wires", Applied Physics Letters, 55 (1991) 2441.
3. R. Flukiger, et al., "High Critical Current Densities in Bi(2223)/Ag Tapes", Superconductor Science & Technology, 5 (1992) S61.
4. D. Dijkkamp, et al., "Preparation of Y—Ba—Cu Oxide Superconducting Thin Films Using Pulsed Laser Evaporation from High Te Bulk Material", Applied Physics Letters, 51, 619 (1987).
5. S. Mahajan, et al., "Effects of Target and Template Layer on the Properties of Highly Crystalline Superconducting a-Axis Films of $YBa_2$—$Cu_3$—$O_7$ by DC-Sputtering", Physica C., 213, 445 (1993).
6. A. Inam, et al., "A-axis Oriented Epitaxial $YBa_2$—$Cu_3$—$O_7$—$PrBa_2Cu_3O_7$ Heterostructures", Applied Physics Letters, 57, 2484 (1990).
7. R. E. Russo, et al., "Metal Buffer Layers and Y—Ba—Cu—O Thin Films on Pt and Stainless Steel Using Pulsed Laser Deposition", Journal of Applied Physics, 68, 1354 (1990).
8. E. Narumi, et al., "Superconducting $YBa_2Cu_3O$__ Films on Metallic Substrates Using In Situ Laser Deposition", Applied Physics Letters, 56, 2684 (1990).
9. J. D. Budai, et al. "In-Plane Epitaxial Alignment of $YBa_2$—$Cu_3$—$O_7$ Films Grown on Silver Crystals and Buffer Layers", Applied Physics Letters, 62, 1836 (1993).
10. T. J. Doi, et al., "A New Type of Superconducting Wire; Biaxially Oriented $Tl1(Ba_{0.8}S_{0.2})_2Ca_2Cu_3O_7$ on [100]<100> Textured Silver Tape", Proceedings of 7th International Symposium on Superconductivity, Fukuoka, Japan, Nov. 8–11, 1994.
11. D. Forbes, Executive Editor "Hitachi Reports 1-meter T1-1223 Tape Made by Spray Pyrolysis", Superconductor Week, Vol. 9, No. 8, Mar. 6, 1995.
12. Recrystallization Grain Growth and Textures, Papers presented at a seminar of the American Society for Metals, Oct. 16 and 17, 1965, American Society for Metals, Metals Park, Ohio.
13. A. Goyal et al., "High Critical Current Density Superconducting Tapes by Epitaxial of $YBa_2Cu_3O_x$ Thick Films on Biaxially Textured Metal Substrates", Appl. Phys. Lett., 69, 1795 (1996).
14. D. P. Norton et al., "Epitaxial $YBa_2Cu_3O_x$ on Biaxially Textured Biaxially Textured (001) Ni: An Approach to High Critical Current Density Superconducting Tape", Science, 274, 755 (1996).
15. M. Paranthaman et al., "Growth of Biaxially Textured Buffered Layers on Rolled Ni Substrates by Electron Beam Evaporation" Physica C., 275, 266 (1997).

BRIEF SUMMARY OF THE INVENTION

The present invention provides a method for mechanically deforming a ductile epitaxially deposited metallic buffer on a textured surface to minimize or eliminate surface irregularities while maintaining the biaxial texture of the buffer layer. The method includes the steps of depositing an epitaxial layer of a metallic buffer on a biaxially textured substrate; and deforming the epitaxial layer between smooth surfaces. Thus, a general objective of the present invention to smooth an epitaxially deposited layer on a textured substrate is accomplished.

Another objective of the present invention is to provide a method for preparing a substrate having a densified HTS precursor. This method includes the steps of depositing an epitaxial layer of a metallic buffer on a biaxially textured metallic surface having a roughness; deforming said biaxially textured substrate having said epitaxial metallic layer between smooth surfaces, if so desired; depositing an epitaxial layer of another material on a surface of said metallic buffer; depositing a layer of HTS precursor on a surface of said epitaxial layer forming an assembly; and densifying said assembly between smooth surfaces. Biaxial texture of the metallic buffer is maintained through the deformation and subsequent annealing treatment at elevated temperatures. This method enables mechanical densification of HTS precursors without the undesirable consequences of loss of biaxial texture and diffusion protection.

Still another objective of the present invention is to provide laminated biaxially textured articles having a smoothed epitaxial layer thereon. This is accomplished by deforming a surface of the epitaxial layer such that the epitaxial layer has a roughness which is equal to or better than the underlying surface.

Yet another objective of the present invention is to provide a laminated biaxially textured articles having a densified HTS precursor thereon suitable for formation of dense HTS precursor material. This is accomplished by providing an epitaxially deposited ductile metallic buffer on a biaxially textured substrate which maintains its biaxial texture after densifying the precursor.

Further objects of the invention will become apparent from the description and figures provided herein.

DETAILED DESCRIPTION OF THE INVENTION

Figure 1:
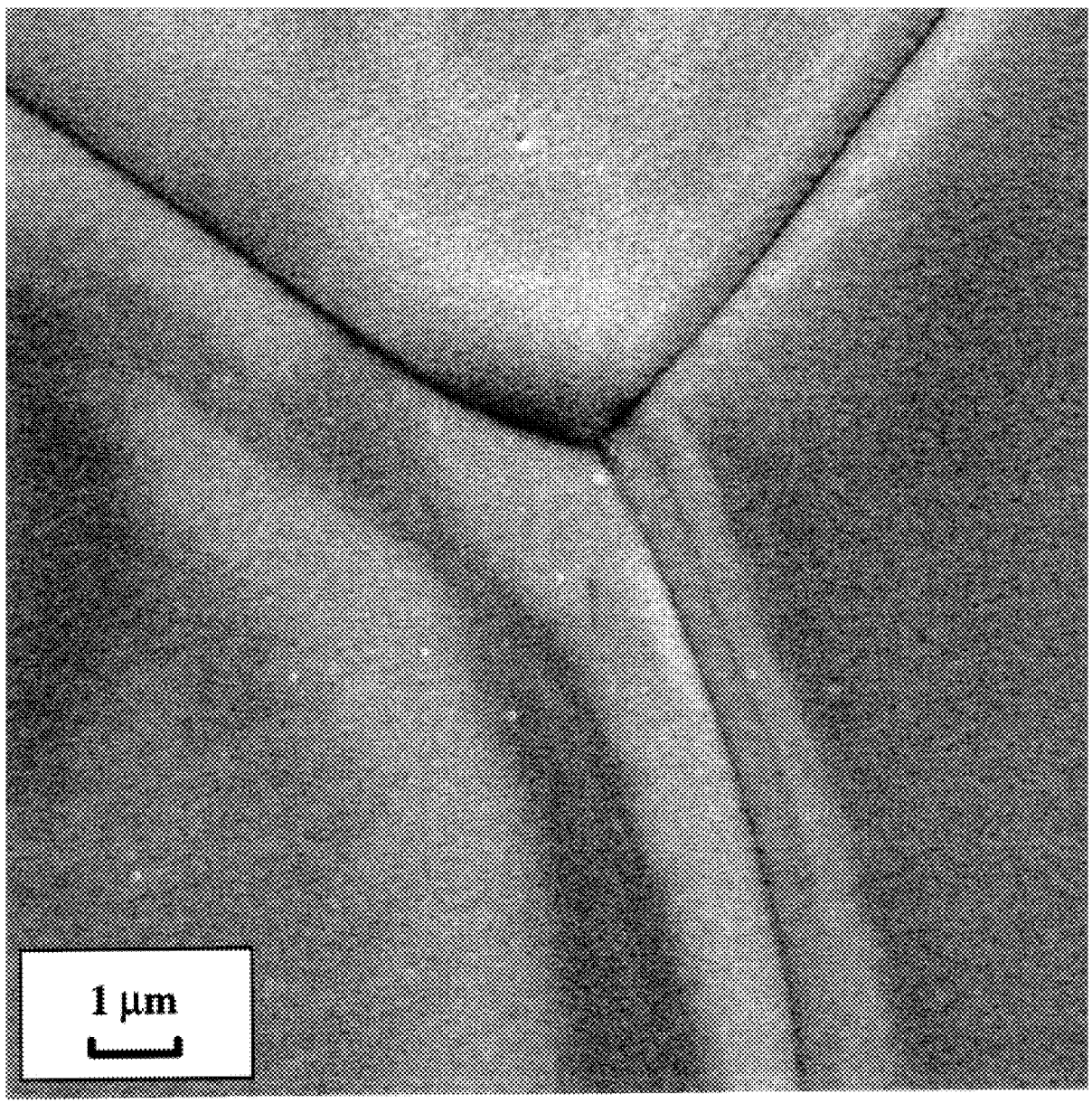
FIG. 1 is a scanning electron micrograph of a biaxially textured Ni substrate annealed at 800° C. for two hours.
Figure 2:
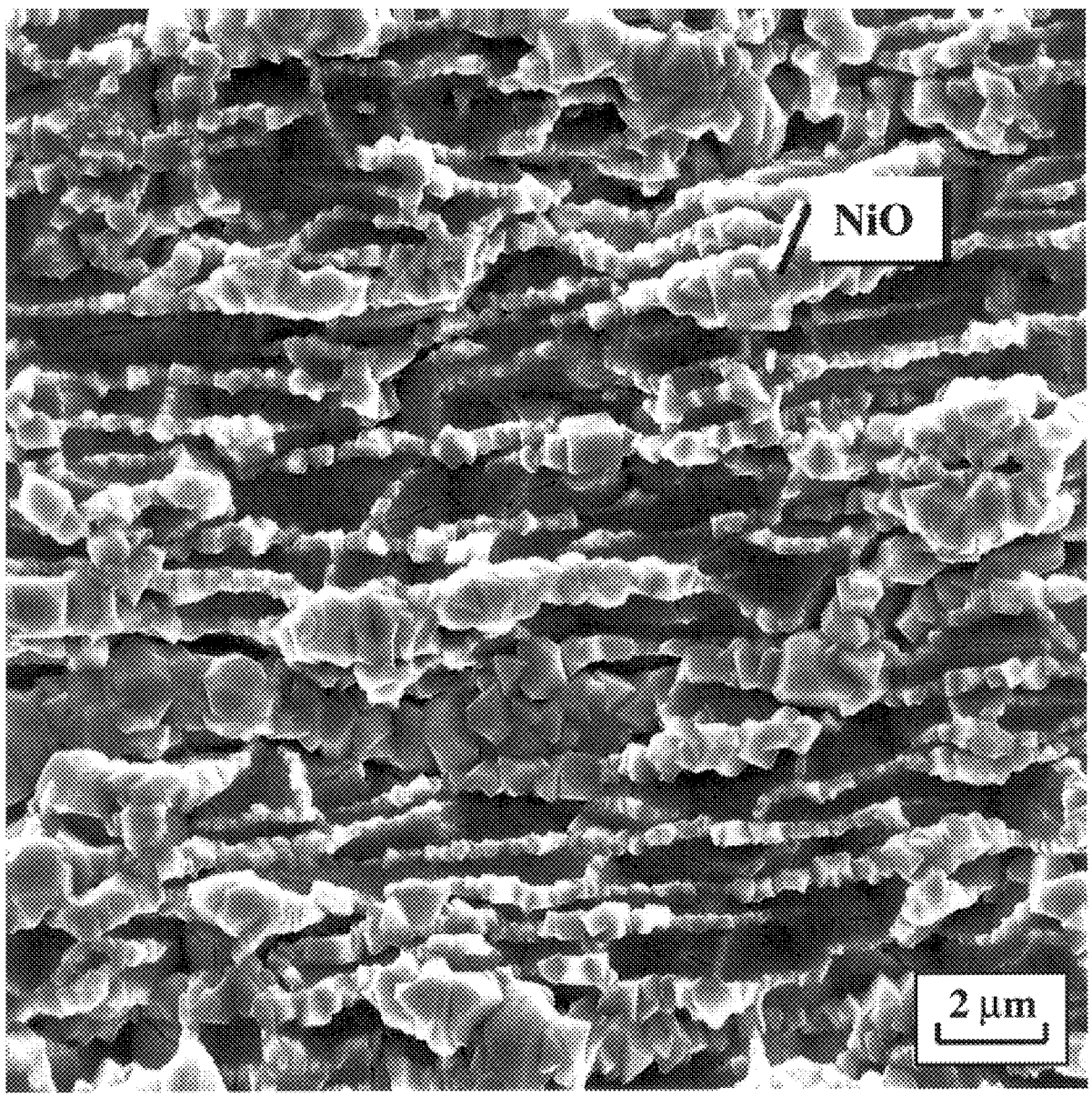
FIG. 2 is a scanning electron micrograph of a YSZ/CeO$_2$/Ni substrate subjected to pressing and annealing in an oxidizing atmosphere.

A biaxially textured substrate having an epitaxial buffer layer is deformed to smooth a surface of the epitaxial layer while maintaining the biaxial texture of the metallic buffer. The buffer layer may also be deformed as a result of densifying a subsequent layer, such as a HTS precursor, while maintaining the biaxial texture of the metallic buffer.

The biaxially textured substrate can be formed using the RABiTS technique from materials such as fully described in U.S. Pat. Nos. 5,739,086 and 5,741,377, which have been fully incorporated herein, and U.S. patent application Ser. No. 08/934,328, which is fully incorporated herein by reference. Preferably, the substrate is a base metal substrate, which is defined as a metal, or alloy thereof, substrate containing at least one non-Noble metals, such as Ni, Cu, Fe, and Al. Most preferably, the base metal substrate is comprised predominantly of at least one non-Noble metal.

Although the RABiTS technique and compatible materials are described herein, similar procedures may be used to provide biaxially textured substrates such as IBAD, Off-Axis-Deposition techniques, or the like with appropriate buffer architecture without departing from the scope of the present invention. For example, Ag buffer can be deposited onto biaxially-textured Pd/CeO$_2$/IBAD-YSZ, biaxially-textured IBAD-MgO, biaxially-textured Pd/CeO$_2$/off-axis sputtered YSZ, and biaxially-textured off-axis e-beamed MgO.

The degree of biaxial texture of a substrate, or subsequently deposited buffer layer, can be characterized by the population of low misorientation angle grain boundaries in the substrate. The population of low misorientation angle grain boundaries can be determined using an x-ray diffraction phi-scan.

An x-ray diffraction phi scan measures the diffracted intensity of x-rays directed at a material as it is rotated about an axis. The axis of rotation is customarily referred to as the phi axis. If the material has good biaxial texture, that is a large population of low misorientation angle grain boundaries, the diffraction intensity is peaked at orientations corresponding to the texture axes.

The width of an x-ray diffraction phi scan peak correlates with the population of low misorientation angle grain boundaries in a material. As the population of grain boundaries having high misorientation angles increases, the width of the peak increases. Correspondingly, as the population of grain boundaries having low misorientation angles increases, the peak width narrows. Preferably, the biaxially textured substrate of the present invention is characterized by a x-ray diffraction phi scan peak width of no more than about 30° FWHM. Most preferably, the biaxially textured substrate has a x-ray diffraction phi scan peak width of no more than about 20° FWHM.

A deformable buffer, such as Ag, or other face-centered cube (FCC), body-centered cube (BCC) or hexagonal close-packed (HCP) crystalline structure metals or alloys thereof, having similar properties as described herein is then epitaxially deposited onto the substrate forming a laminate article. Advantageously, certain metallic buffers, such as Ag, retains its biaxial texture after deformation or annealing even if the underlying material does not. This particular characteristic is especially useful when the underlying substrate has particular qualities which are independent of its texture and the texture is lost due to subsequent deformation of the buffer.

Following epitaxial metallic buffer deposition, the laminate article is mechanically deformed between smooth surfaces such as rolling between polished rolls or pressing between polished platens. This deformation operation minimizes or eliminates the surface roughness of the laminate article. Subsequent buffer(s) and/or HTS deposition may then be deposited onto the textured laminate article as described herein.

The deformable buffer layer is epitaxially deposited onto the biaxially-textured substrate and maintains its biaxial texture even after subjecting it to deformation, such as by pressing or rolling, and annealing. Deformation of the epitaxial buffer layer provides smoothing of the biaxially-textured substrate without the loss of cube-on-cube epitaxy.

A smoothed surface of a layer on an underlying substrate is defined as a surface having a surface roughness which is less than or equal to the surface roughness of the underlying substrate. Surface roughness, also referred to as out-of-plane texture, is a measure of irregularities, such as thermal grooves, on a surface which can be measured by methods known in the art.

One particular method of indirectly estimating surface roughness is an x-ray diffraction omega scan which measures the diffracted intensity of x-rays directed at a material as it is pivoted about an in-plane axis. If the material has a low surface roughness, the diffraction intensity exhibits a narrow peak. Preferably, a smooth surface is characterized by an x-ray diffraction omega scan of no more than 10° FWHM.

The substrate having the deformed buffer layer may be annealed to further develop the buffer texture. Thus, the present invention can sharpen the degree of both out-of-plane and in-plane alignment on biaxially-textured substrates when the texture quality of the substrate material is marginal. The schedule of the deformation and/or annealing steps may differ depending upon the materials involved and desired texture.

Advantageously, a HTS precursor deposited onto the deformable buffer can be densified without the loss of the biaxial texture of the underlying substrate, thus allowing the development of the HTS biaxial texture during subsequent HTS formation. To densify a HTS precursor layer, such as MgO, CeO$_2$, YSZ, Y$_2$O$_3$ or RE$_2$O$_3$ (e.g. Yb$_2$O$_3$), the metallic buffer is epitaxially deposited either directly onto a substrate or a buffered substrate forming a laminate article. Following deposition, the metallic buffer is mechanically deformed if a smoother surface is required.

Depending on the specific epitaxial requirement of the HTS under consideration, additional buffer layers may be deposited epitaxially onto the laminate article. Following deposition of any additional buffer layers, an HTS precursor is deposited onto the laminate article by methods known in the art, such as powder deposition or solution precursor approaches.

Mechanical densification of the precursor takes place, such as by rolling or pressing, once the precursor has been processed to its powder form. Since the metallic buffer is ductile, it maintains the diffusion barrier function even if the ceramic buffers are cracked during the deformation operation. Moreover, as shown in Examples 3 and 4, since biaxial texture of the metallic buffer is not altered by deformation and annealing treatments, subsequent high temperature annealing will enable the formation of biaxially-textured HTS.

The present invention provides articles which are useful for HTS. A preferred composition of the present invention is a laminate article comprising a base metal substrate, such as Ni, which is biaxially textured using thermomechanical deformation, such as the RABiTS technique. A layer of CeO$_2$ is epitaxially deposited onto the substrate followed by an epitaxial layer of Pd. A Ag buffer epitaxial layer is then deposited onto the Pd/CeO$_2$/Ni laminate article.

In one embodiment described in Example 1, the surface of a Ag buffer is modified by pressing a Ag/Pd/CeO$_2$/Ni laminate article to smooth the Ag buffer without degrading its texture. In a second embodiment, described in Example 2, the surface of the Ag buffer is modified by rolling a Ag/Pd/CeO$_2$/Ni laminate article to smooth the Ag buffer without degrading its texture.

Following the surface modification step, selected ceramic buffers, such as HTS precursors having demonstrated epitaxial relationship with the HTS of interest may be epitaxially deposited onto the Ag buffer surface before subsequent HTS deposition. In addition to HTS device materials, however, other device materials such as photovoltaic, ferroelectric and optical materials may be deposited onto the deformed layer without departing from the scope of the present invention.

In third and fourth embodiments a HTS precursor is deposited on a Ag/Pd/CeO$_2$/Ni biaxially textured laminate article as described above. Following heat treatment to convert the precursor to its powder form, the HTS precursor is densified by pressing or rolling the laminate article, as described in Examples 3 and 4, respectively. The densification step and annealing does not alter the biaxial texture of the Ag buffer even though the underlying layer texture may be lost. Advantageously, the Ag buffer layer can be smoothed, as described in Examples 1 and 2, prior to densification to ensure good biaxial texture. Following densification, a superconducting material, such as ReBCO, BSCCO, or TBSCCO, is deposited on the precursor layer to form a superconducting device.

EXAMPLE 1

Surface Roughness Modification of Textured Article by Uniaxial Pressing

A Ni substrate is biaxially textured using the RABiTS technique. The as-rolled Ni substrate is cleaned ultrasonically with both acetone and ethanol, and recrystallized to the desired {100}<100> cube texture by annealing the substrate at about 800° C. for approximately 2 hours in a vacuum of about $10^{-6}$ Torr. The biaxially-textured Ni substrate is then mounted onto a substrate holder with a heater assembly in a chamber of an electron-beam (e-beam) system. After the vacuum in the chamber has reached about $1 \times 10^{-6}$ Torr at room temperature, a gas mixture of 4% $H_2$ and 96% Ar is introduced until the pressure inside the chamber reaches 1 Torr. The Ni substrate is then annealed at about 650° C. for approximately 1 hour at that pressure.

The chamber pressure is then reduced to and maintained at a pressure of about $2 \times 10^{-5}$ Torr using a flowing mixture of 4% $H_2$ and 96% Ar. The flowing gas mixture inside the chamber is controlled by a dc-powered piezoelectric valve. A $CeO_2$ layer is grown on the Ni substrate in the chamber at temperatures ranging from about 200–750° C. The deposition rate for the $CeO_2$ is about 1–5 Å/sec at an operating pressure of approximately $10^{-5}$ Torr. The final thickness of the $CeO_2$ layer varies from about 10 nm–50 nm. A graphite crucible inside the chamber contains cerium metal to provide a source of the $CeO_2$.

Following the $CeO_2$ buffer deposition, Pd metallic layer is deposited onto the $CeO_2$/Ni article in the e-beam system. The procedure of Pd deposition is substantially identical to that of $CeO_2$, and the thickness of the Pd varies between about 50 nm–200 nm using Pd metal as the source.

Following $CeO_2$ and Pd deposition, a thick metallic Ag buffer is deposited by radio frequency magnetron sputtering. The biaxially-textured Pd/$CeO_2$/Ni article is mounted on a heating block inside a sputter chamber. Prior to heating the article, the sputter chamber is evacuated to a pressure of about $1 \times 10^{-6}$ Torr. The chamber is then back-filled with a flowing mixture of 4% $H_2$ and 96% Ar to a pressure of about $5 \times 10^{-2}$ Torr. The article is heated to about 150–750° C. where Ag deposition occurs. Once the deposition temperature is reached, the pressure inside the chamber is reduced to about $1 \times 10^{-2}$ Torr and sputtering commences using an on-axis Ag target positioned approximately 6 cm from the articles. Preferably, the plasma power is about 75 W at 13.56 MHz and the resulting Ag buffer is approximately 25 microns thick.

Figure 3:
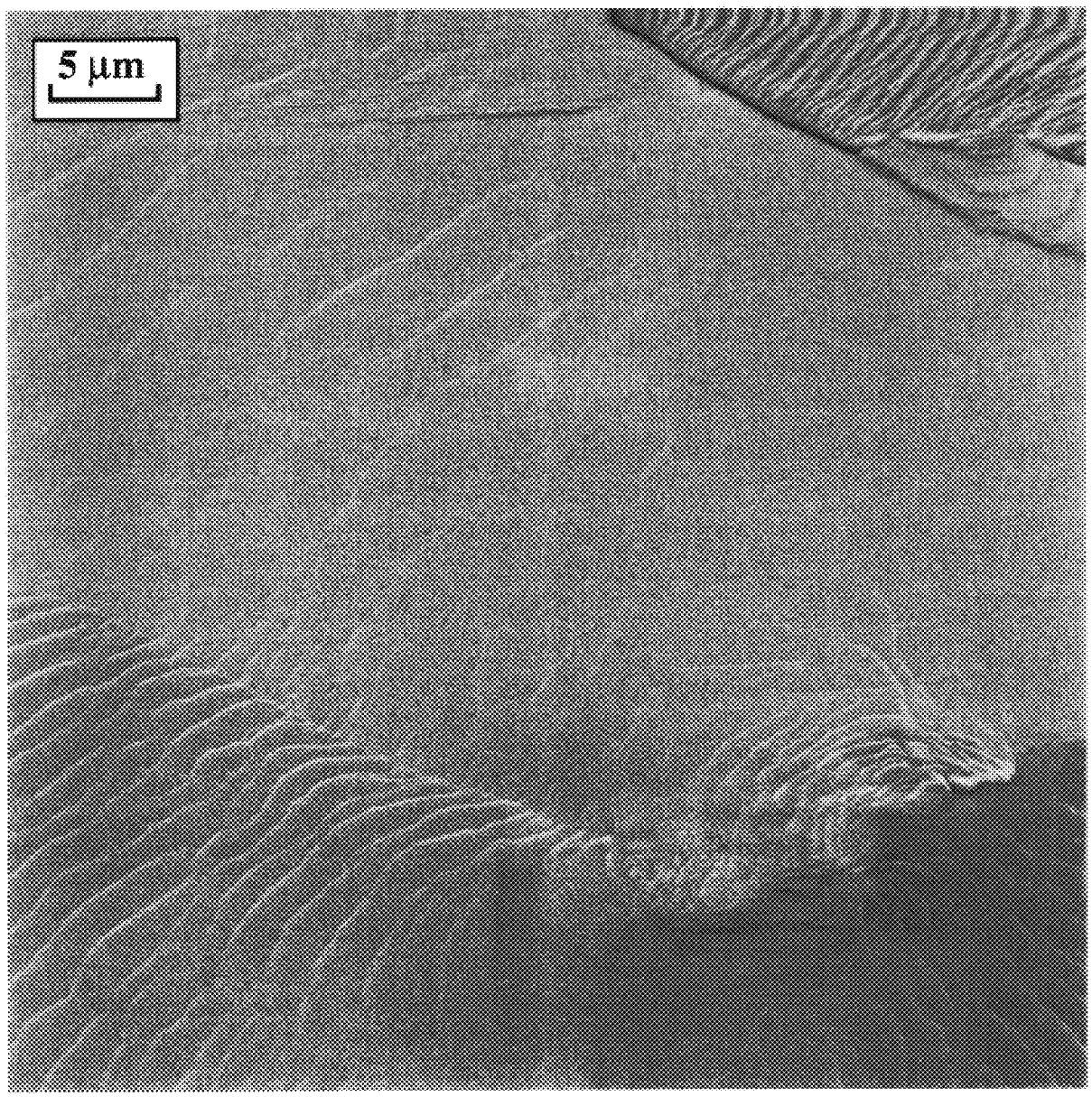
FIG. 3 is a scanning electron micrograph of an as-sputtered surface of a Ag buffer deposited onto a Pd/CeO$_2$/Ni sample.
Figure 4:
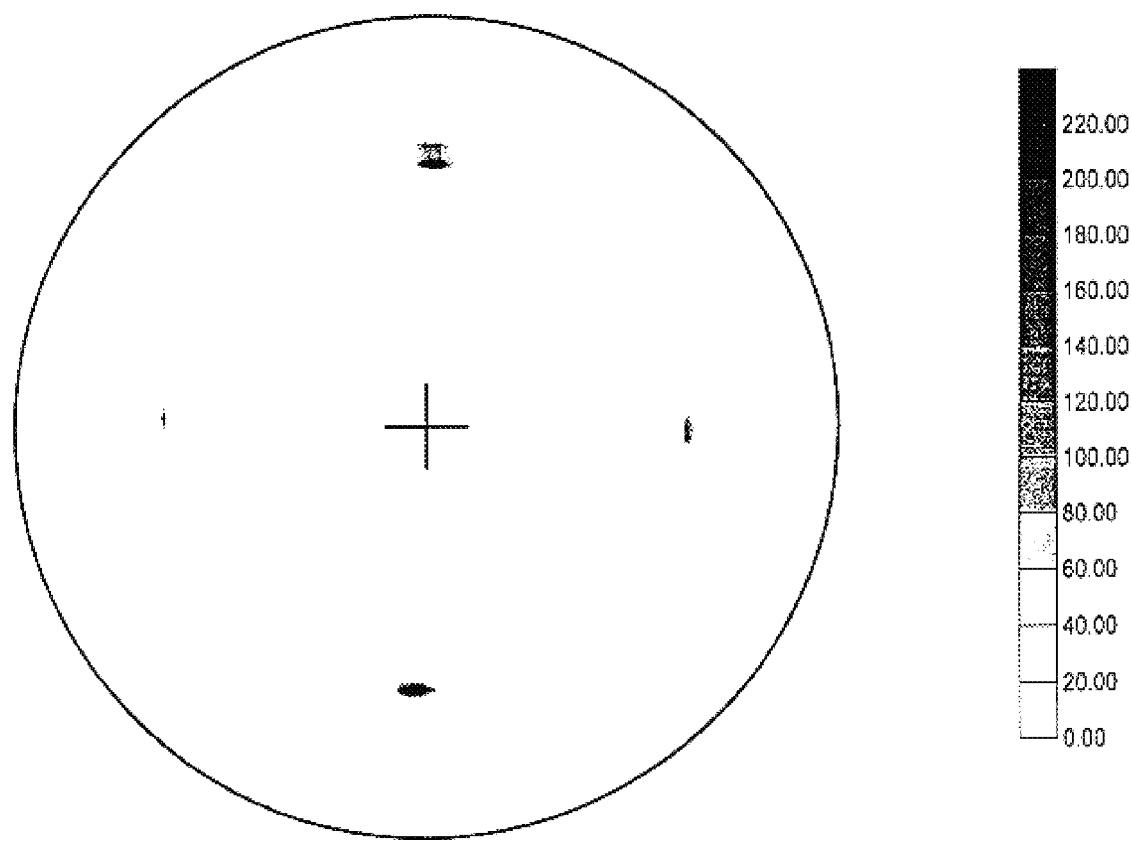
FIG. 4 is a (111) Ag pole figure of the as-sputtered Ag/Pd/CeO$_2$/Ni sample shown in FIG. 3.
Figure 5:
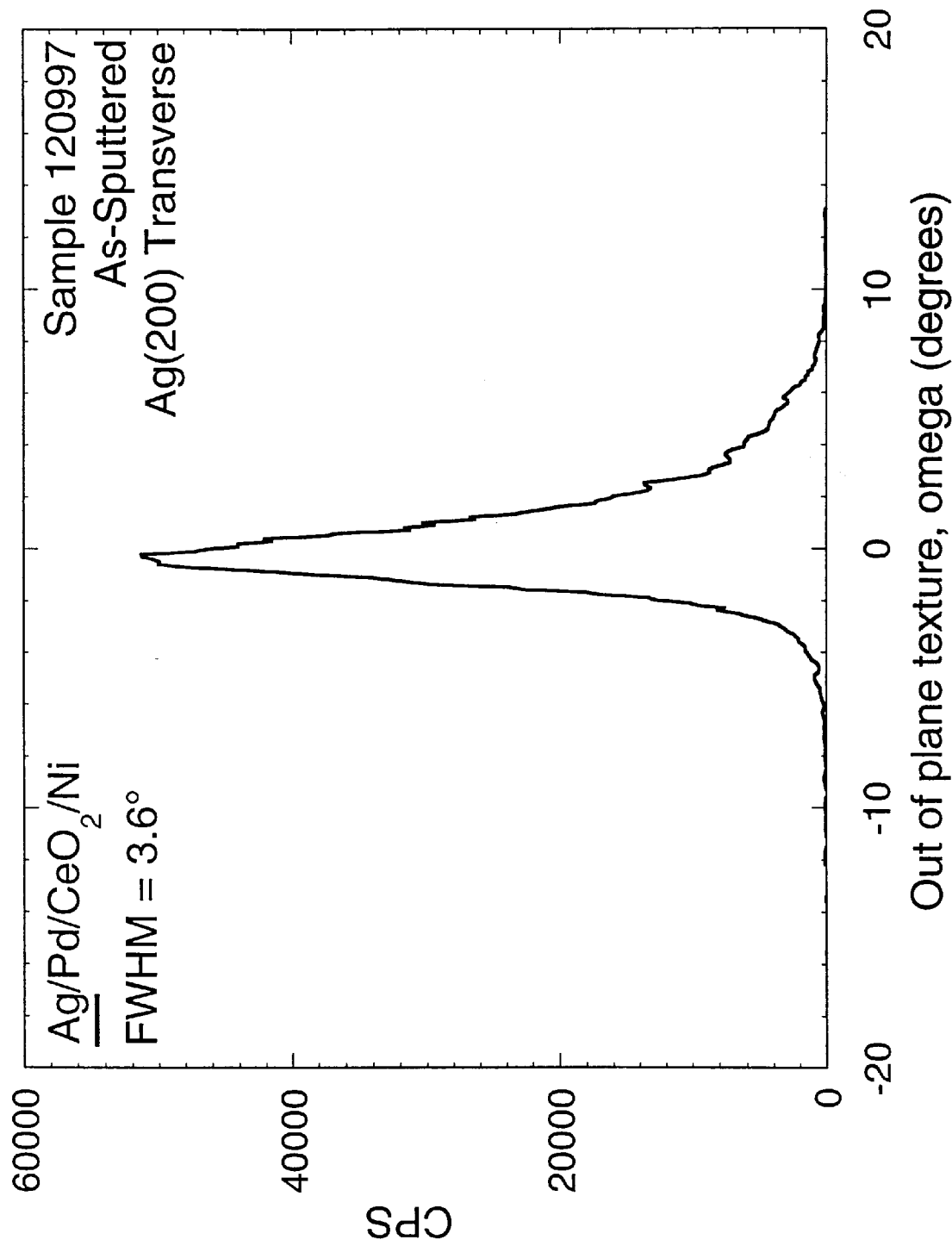
FIG. 5 is a transverse x-ray diffraction omega scan showing the out-of-plane texture of the (200) Ag plane on the as-sputtered sample shown in FIG. 3 with an omega scan peak of 3.6° FWHM.
Figure 6:
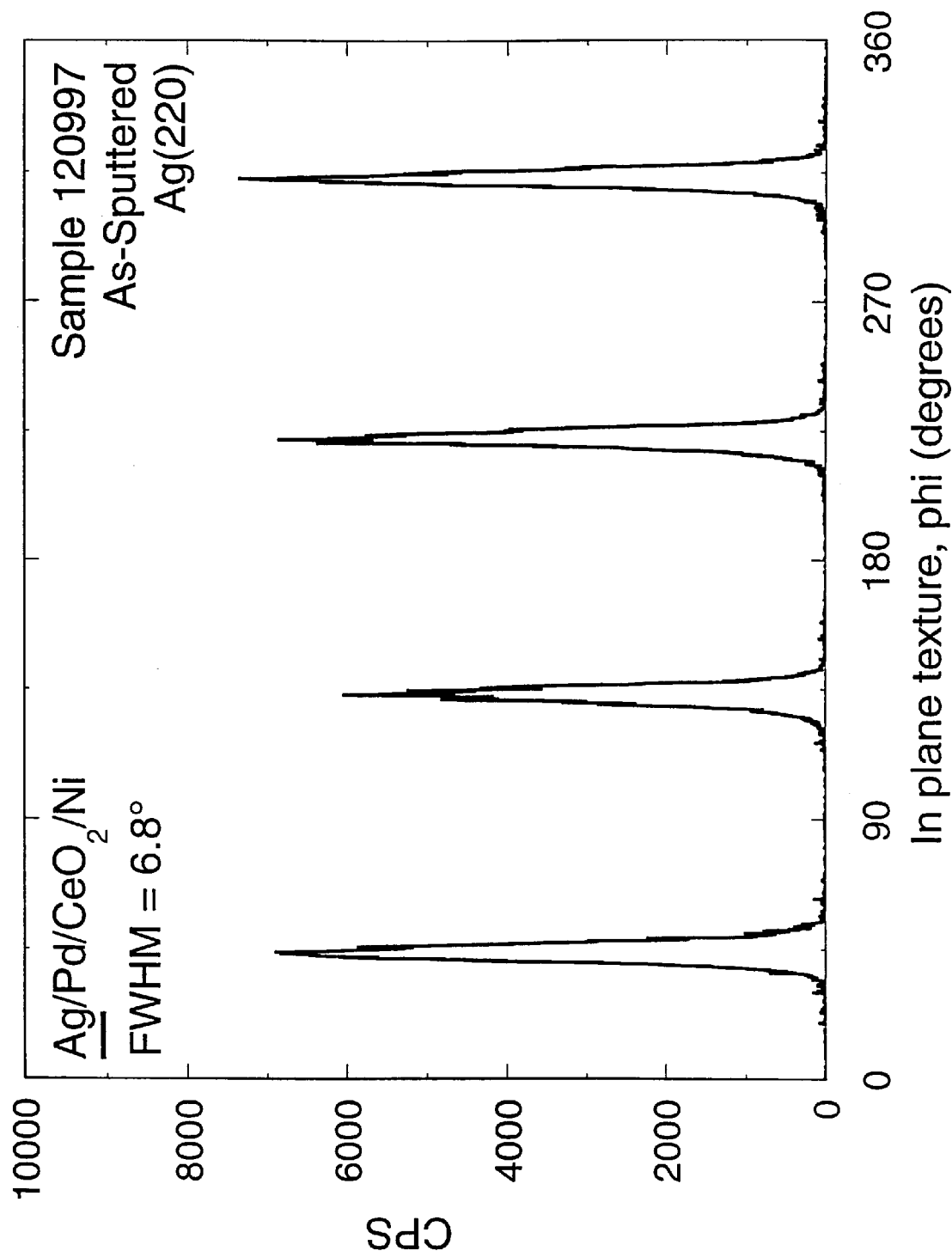
FIG. 6 is a x-ray diffraction phi scan showing the in-plane texture of the (220) Ag plane on the as-sputtered sample shown in FIG. 3 with a phi scan peak of 6.8° FWHM.

FIG. 3 shows a scanning electron image of the as-sputtered Ag surface. It can clearly be seen from this figure that the Ag buffer contained grooved grain boundaries and growth ledges. The as-sputtered Ag buffer was biaxially-textured as shown in the (111) Ag pole figure (FIG. 4), with an out-of-plane plane alignment (ω-scan, (200) Ag plane) of 3.6° full-width-half-maximum (FWHM) (FIG. 5) and an in-plane alignment (φ-scan, (220) Ag plane) of 6.8° FWHM (FIG. 6). The (111) Ag pole figure shown in FIG. 4 clearly shows the cube on cube biaxial texture of the Ag buffer.

Figure 7:
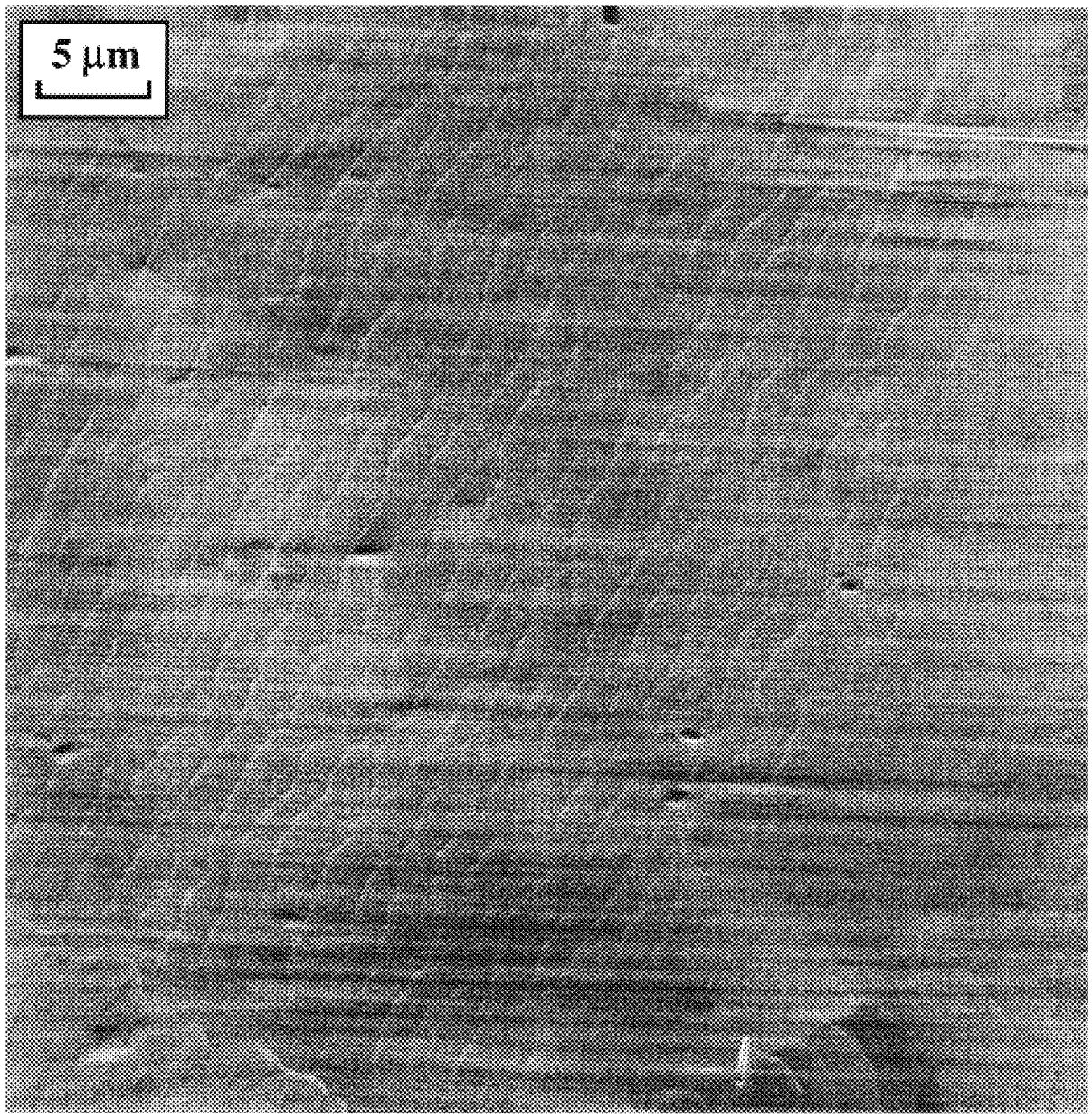
FIG. 7 is a scanning electron micrograph of the Ag buffer on the sample shown in FIG. 3 after being subjected to uniaxial pressing at a pressure of 750 MPa.
Figure 8:
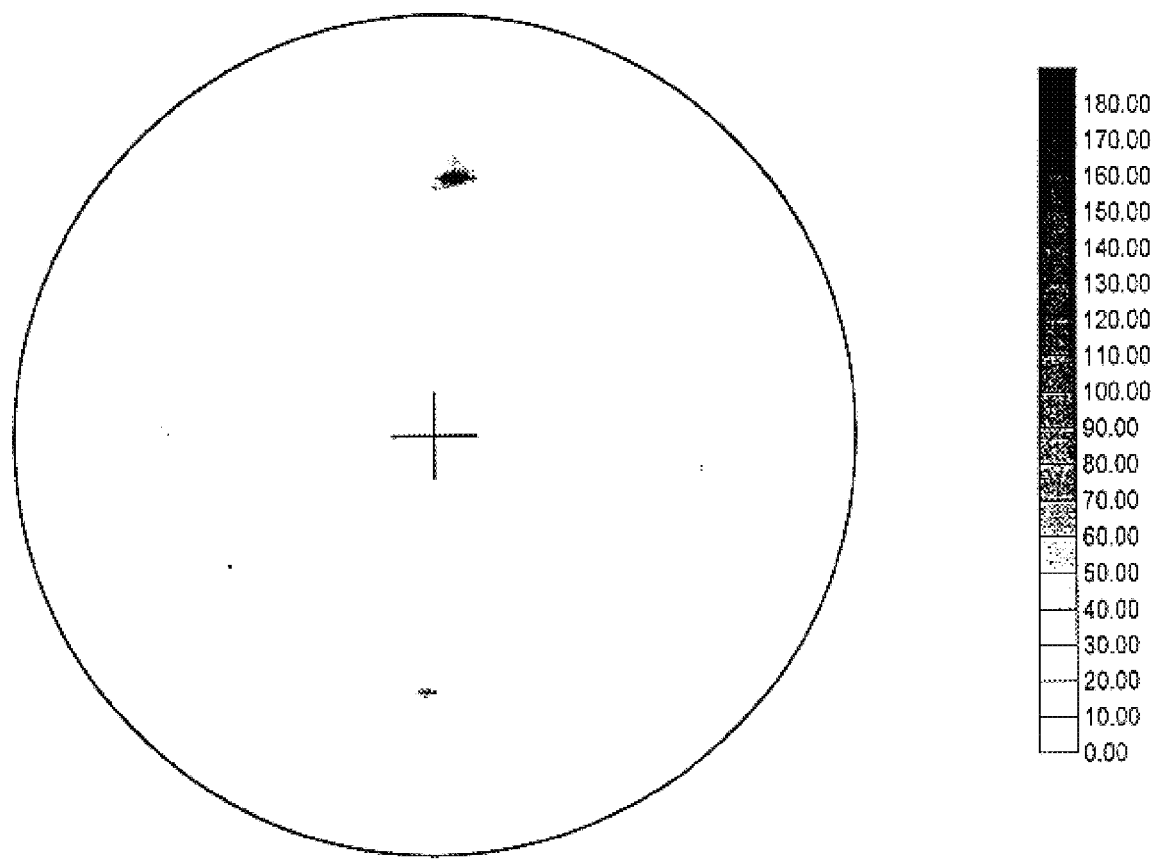
FIG. 8 is a (111) Ag pole figure of the sample shown in FIG. 7.
Figure 9:
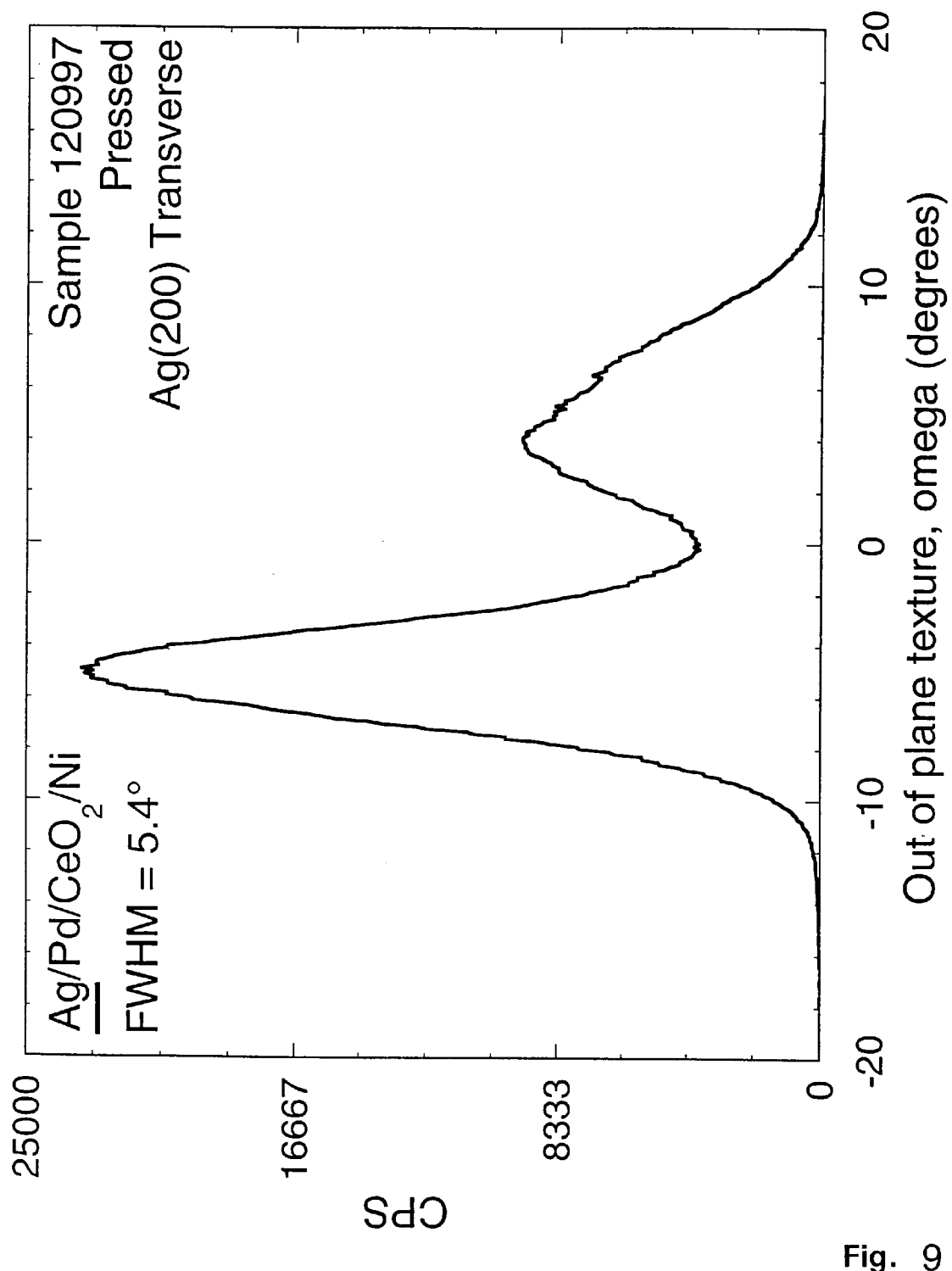
FIG. 9 is a transverse x-ray diffraction omega scan showing the out-of-plane texture of the (200) Ag plane on the pressed sample shown in FIG. 7 with an omega scan peak of 5.4° FWHM.
Figure 10:
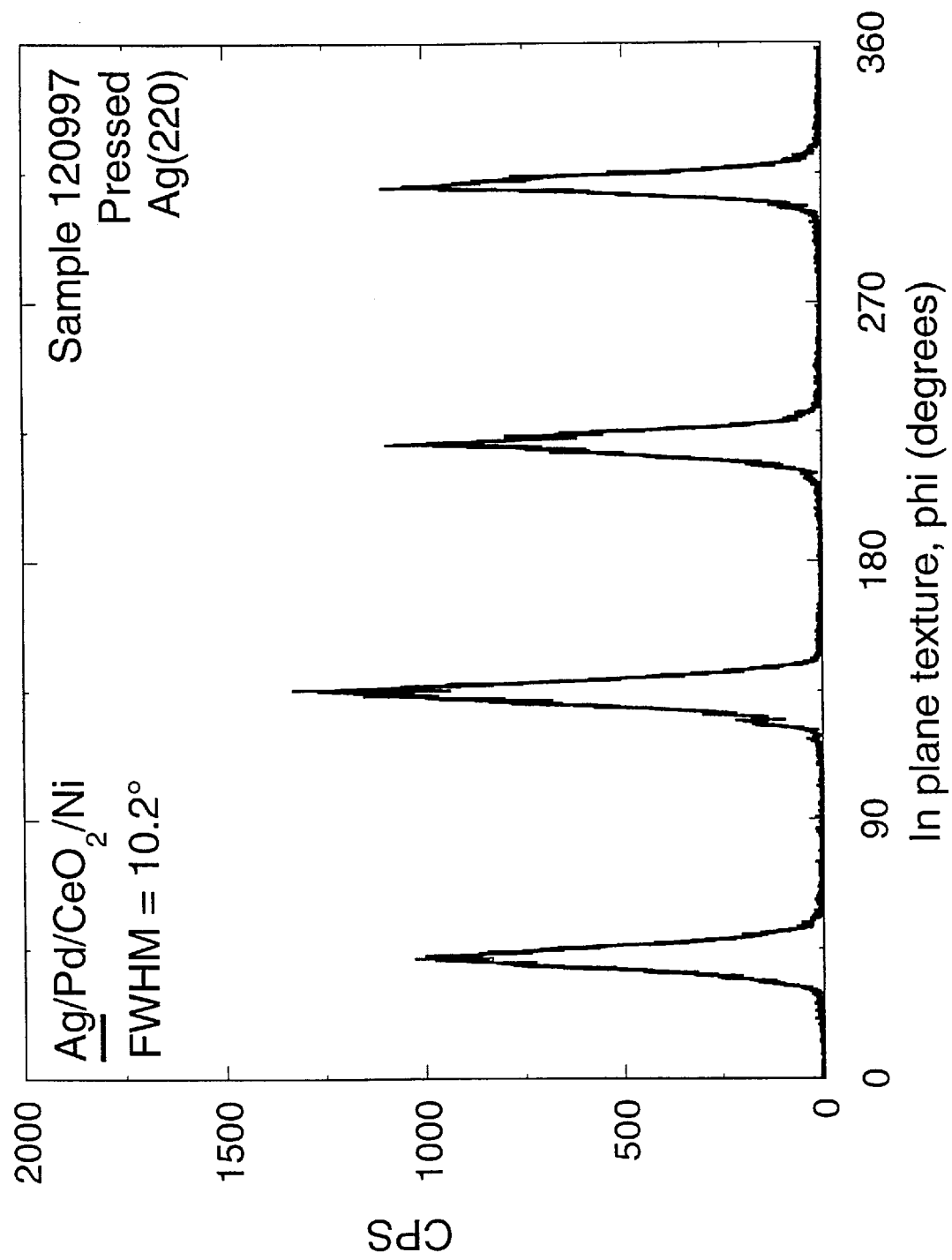
FIG. 10 is a x-ray diffraction phi scan showing the in-plane texture of the (220) Ag plane on the pressed sample shown in FIG. 7 with a phi scan peak of 10.2° FWHM.

This sample was then subjected to uniaxial pressing between polished steel platens at about 750 MPa pressure. After pressing, surface roughness due to grain boundaries as well as growth ledges was found to have been reduced as shown in FIG. 7. (111) Ag pole figure of the deformed sample (FIG. 8) remained identical to that of the undeformed stage, indicating that the biaxial texture has not been altered in the Ag buffer. The out-of-plane texture ((200) Ag plane) was found to be 5.4° FWHM with splitting in the intensity peak due to minor grain rotation in the direction perpendicular to sample axis (FIG. 9). This peak splitting is absent along the sample axis indicating no grain rotation along the sample/current direction. In addition, the in-plane texture of the deformed Ag buffer ((220) Ag plane) was determined to be 10.2° FWHM as shown in FIG. 10. These detailed X-ray examinations confirmed that pressing of Ag buffer does not alter the cube-on-cube biaxial alignment that is essential in the development of textured articles.

As disclosed above, following the surface modification step, selected ceramic buffers having demonstrated epitaxial relationship with the HTS of interest such as MgO, $CeO_2$, YSZ, $Y_2O_3$ or $RE_2O_3$ (e.g. $Yb_2O_3$) may be epitaxially deposited onto the textured article before subsequent HTS deposition.

EXAMPLE 2

Surface Roughness Modification of Textured Article by Rolling

Figure 11:
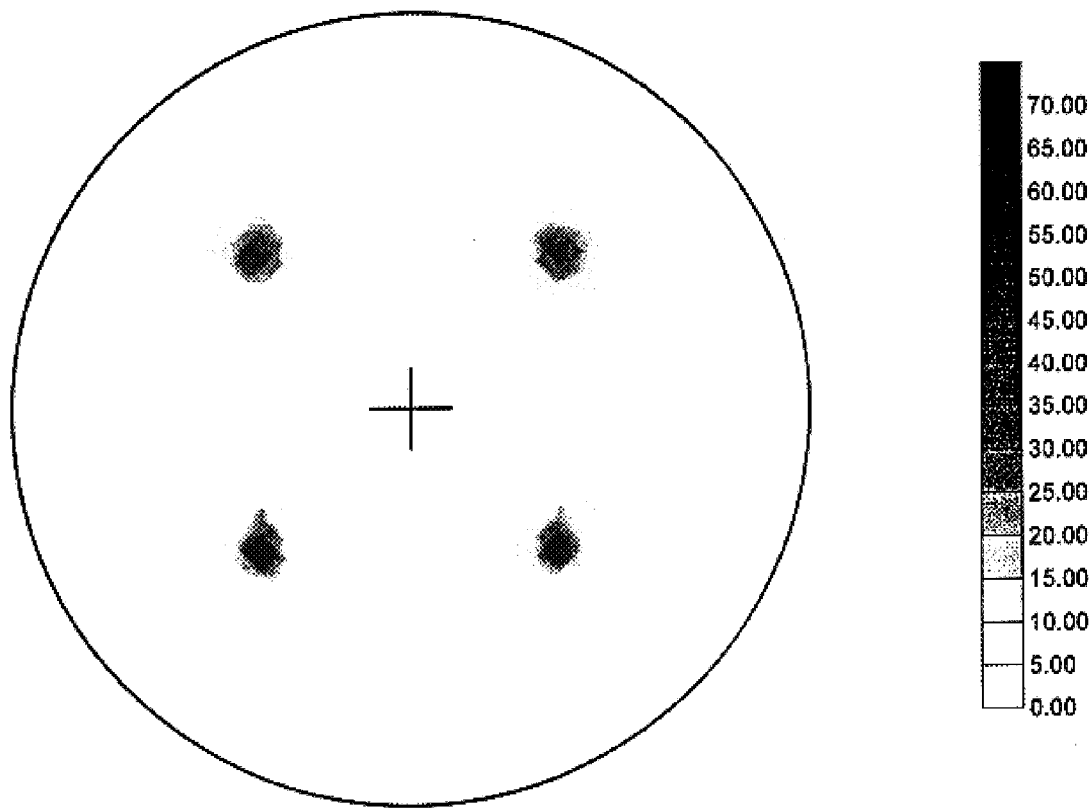
FIG. 11 is a (220) Ag pole figure of an as-sputtered Ag/Pd/CeO$_2$/Ni sample.
Figure 12:
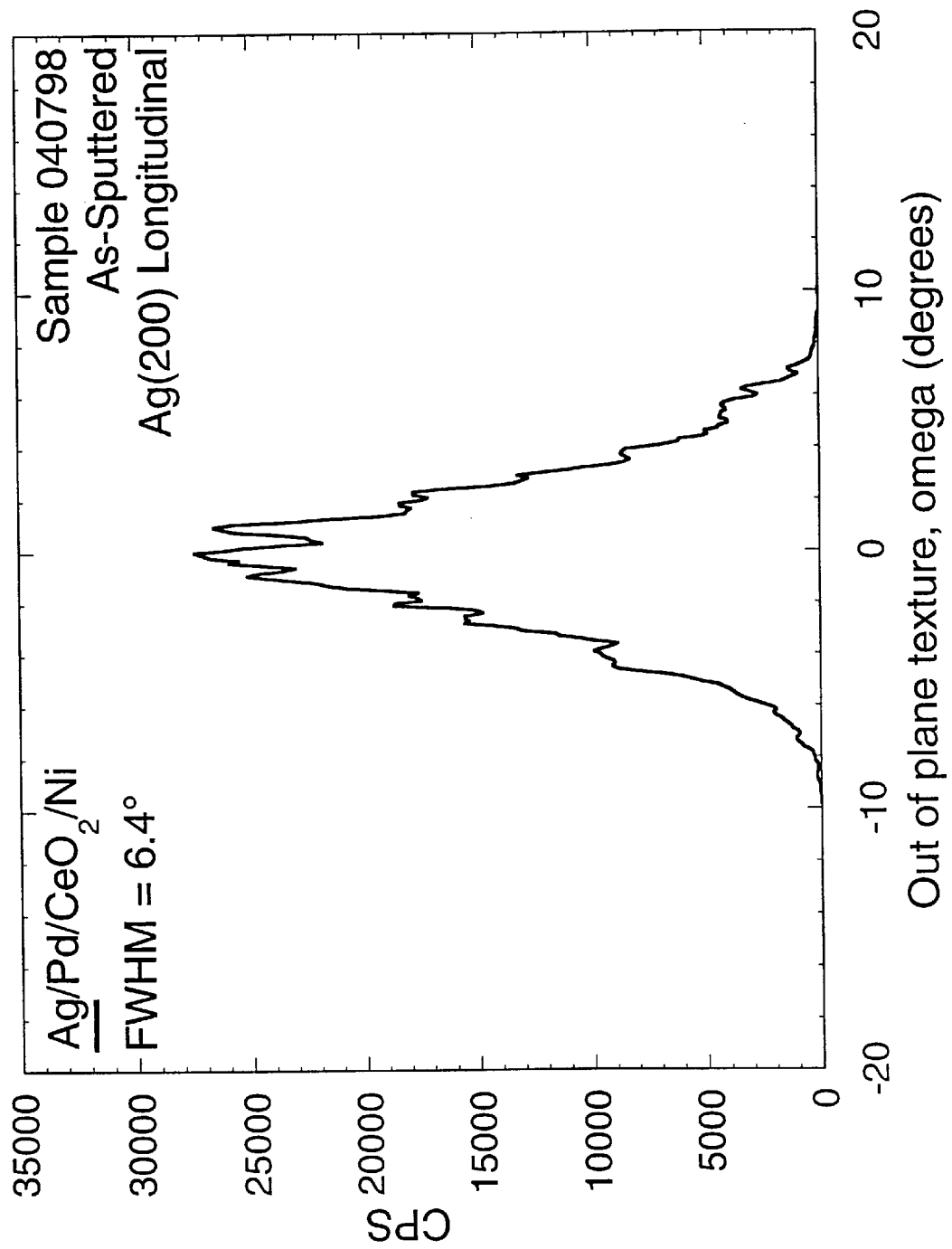
FIG. 12 is a longitudinal x-ray diffraction omega scan showing the out-of-plane texture of the (200) Ag plane on the as-sputtered sample shown in FIG. 11 with an omega scan peak of 6.4° FWHM.
Figure 13:
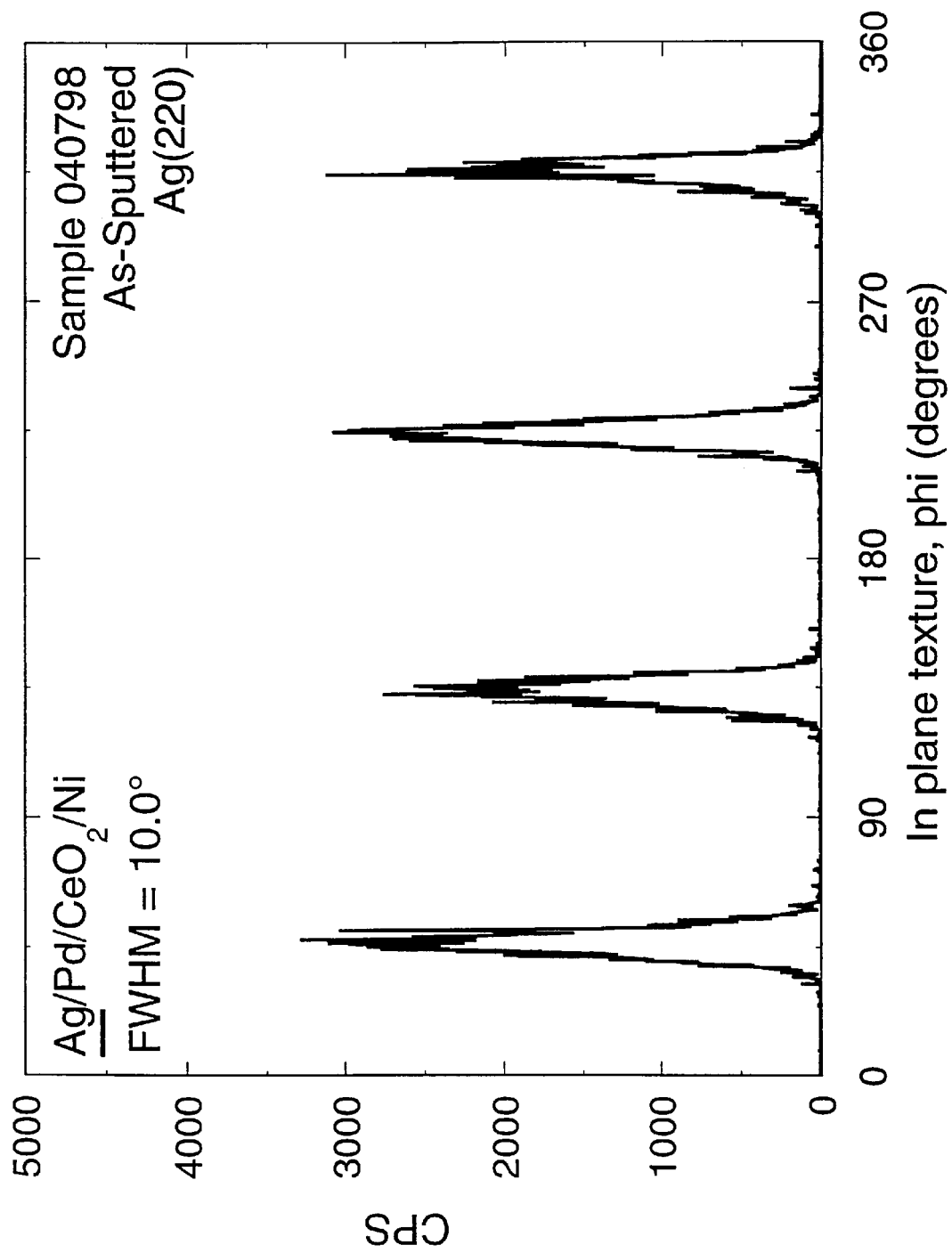
FIG. 13 is a x-ray diffraction phi scan showing the in-plane texture of the (220) Ag plane on the as-sputtered sample shown in FIG. 11 with a phi scan peak of 10.0° FWHM.

An epitaxial Ag buffer is deposited onto a biaxially-textured Pd/$CeO_2$/Ni article as detailed in Example 1. As shown in FIG. 11, (220) Ag pole figure of the as-sputtered Ag buffer is biaxially textured indicating that cube-on-cube relationship with the textured article is maintained. Out-of-plane and in-plane alignments of the Ag buffer determined from ω (FIG. 12) and φ-scans (FIG. 13) of the (200) and (220) planes are 6.4° FWHM and 10.0° FWHM, respectively.

Figure 14:
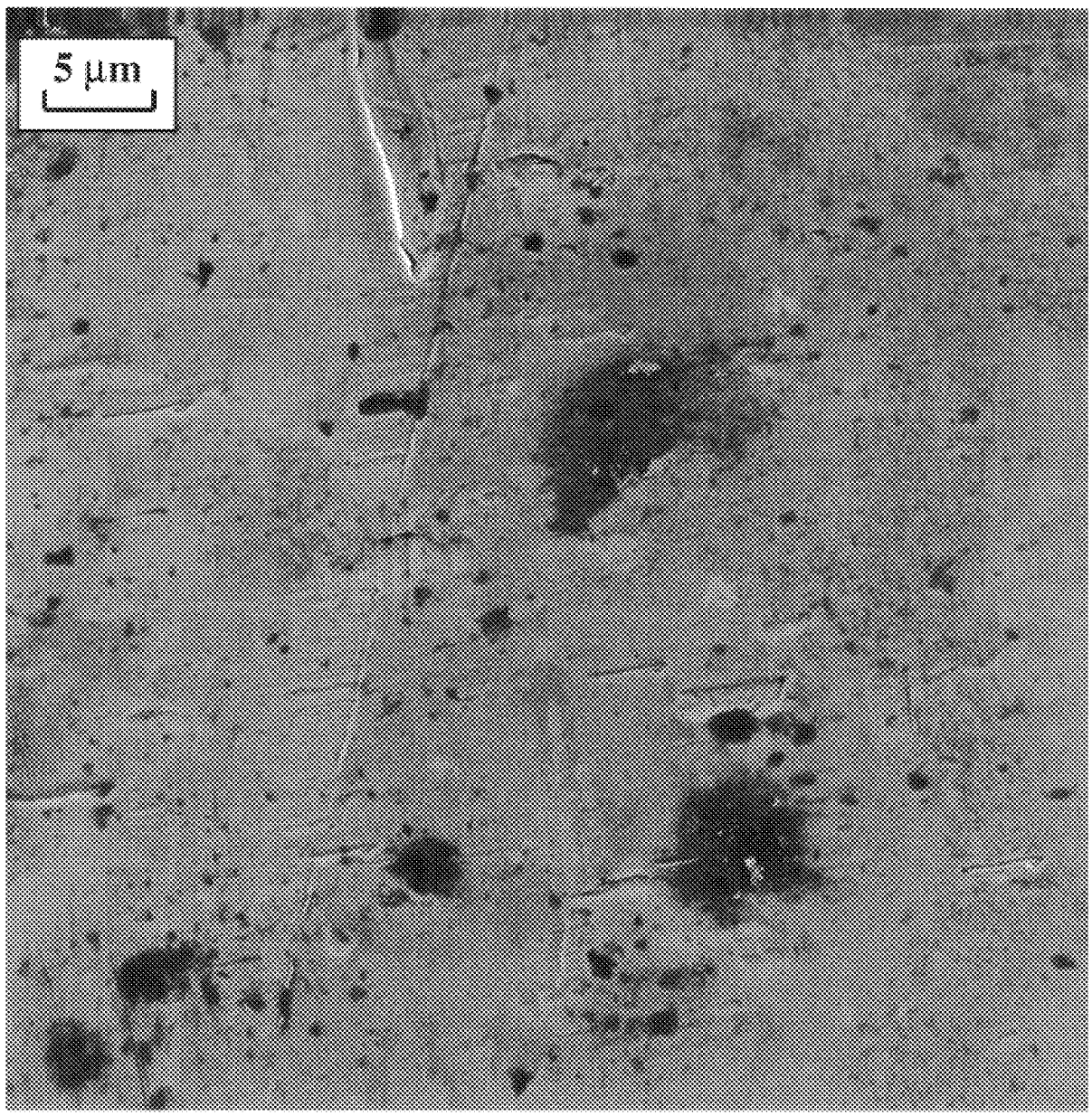
FIG. 14 is a scanning electron micrograph of Ag buffer on the sample shown in FIG. 11 after it had been rolled from an initial thickness of 150 microns to a final thickness of 141.5 microns.
Figure 15:
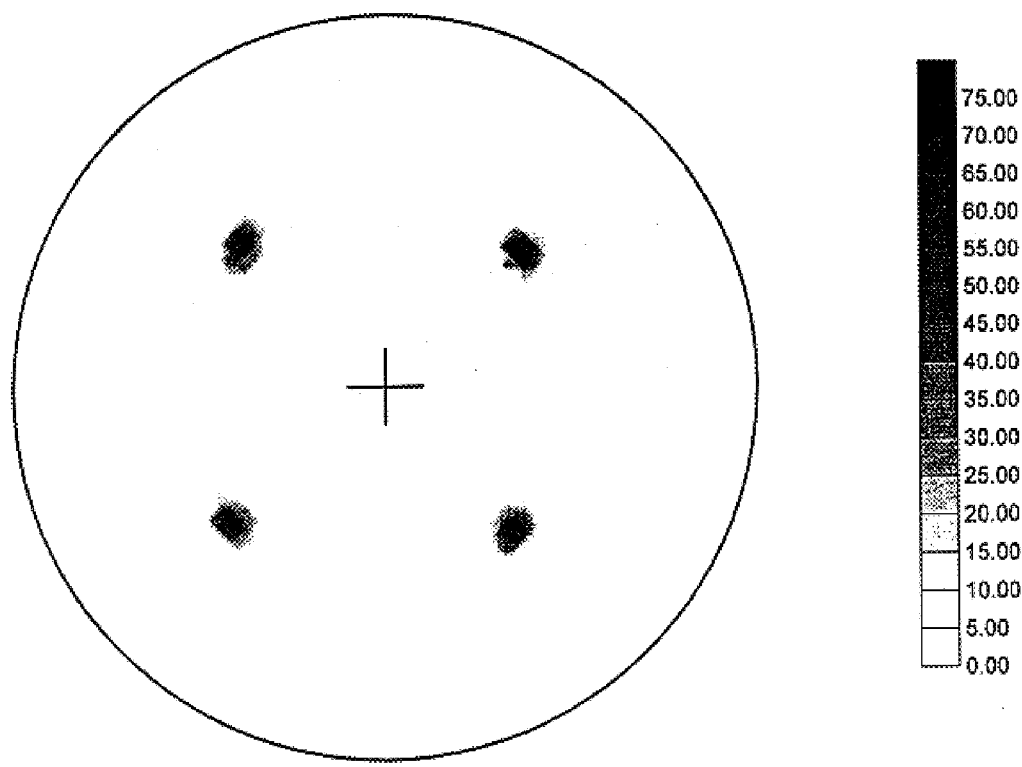
Fig.15 is a (220) Ag pole figure of the rolled sample shown in FIG. 14.
Figure 16:
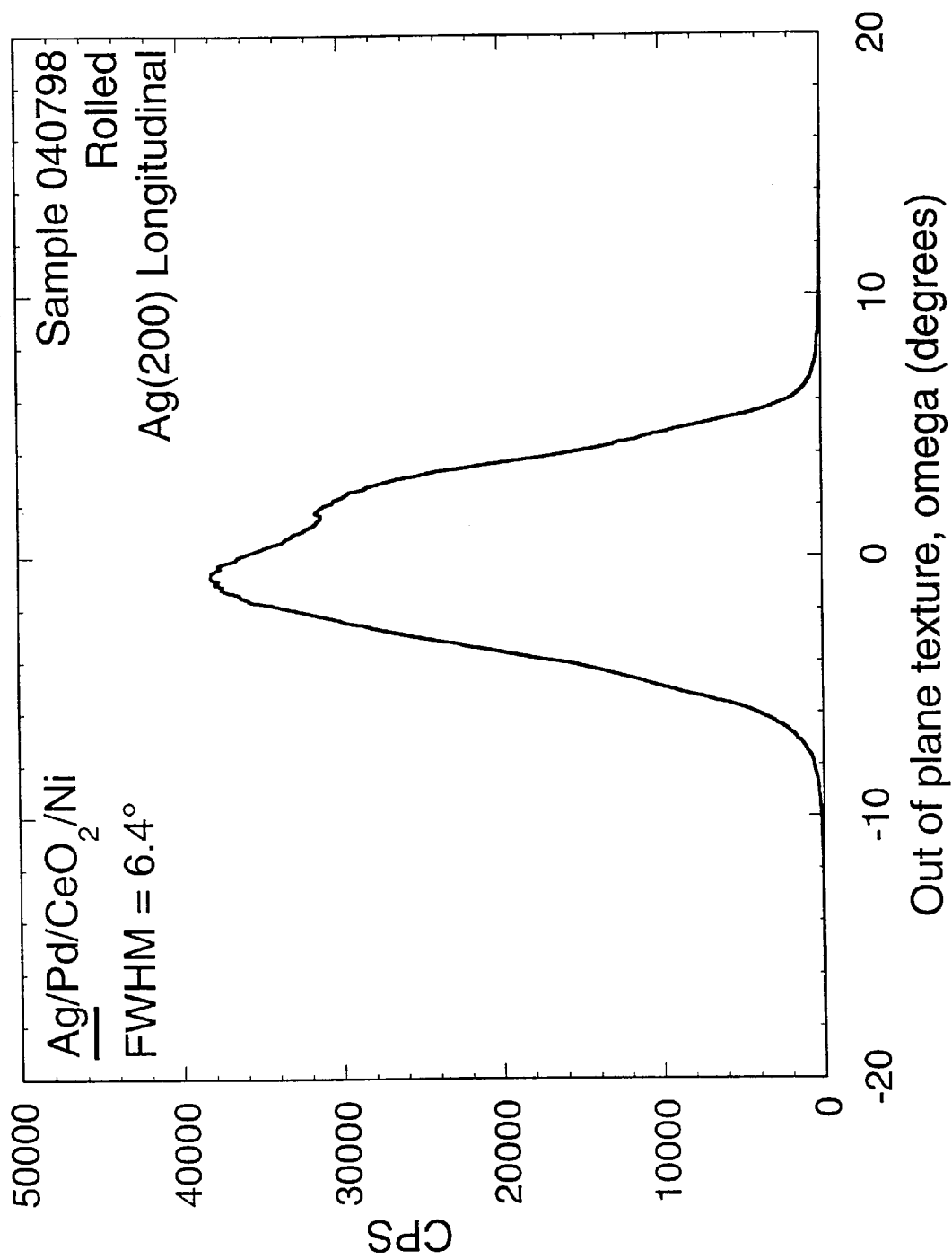
FIG. 16 is a longitudinal x-ray diffraction omega scan showing the out-of-plane texture of the (200) Ag plane on the rolled sample shown in FIG. 14 with an omega scan peak of 6.4° FWHM.
Figure 17:
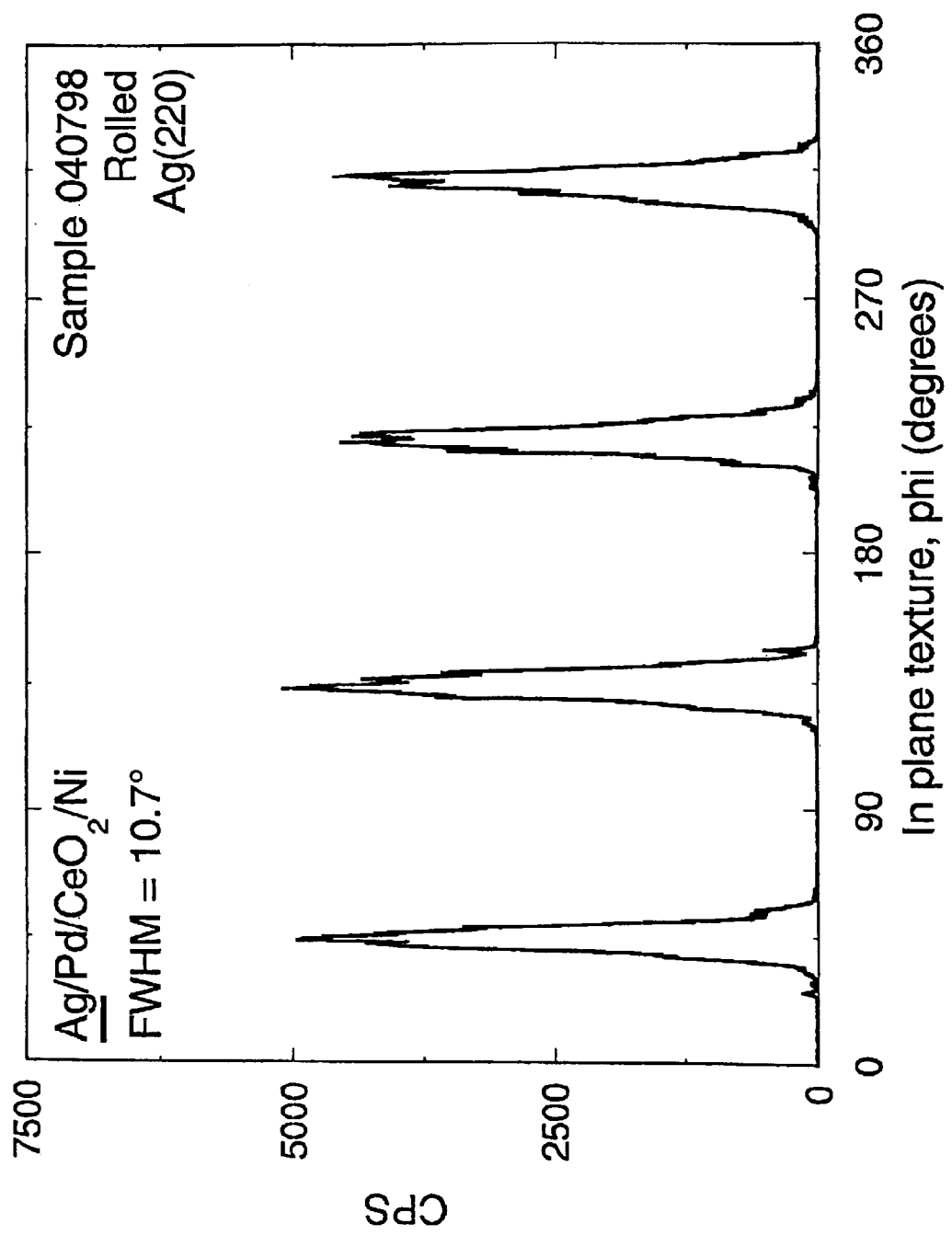
FIG. 17 is a x-ray diffraction phi scan showing the in-plane texture of is the (220) Ag plane on the rolled sample shown in FIG. 14 with a phi scan peak of 10.7° FWHM.

This sample is placed between smooth Ni tapes and rolled from an initial sample thickness of about 150 microns to a final thickness of about 141.5 microns. After rolling, grain boundaries grooves as well as growth ledges are found to have been eliminated as shown in FIG. 14. (220) Ag pole figure of the rolled sample (FIG. 15) remained identical to that of the undeformed stage, indicating that the biaxial texture is not altered in the Ag buffer. The out-of-plane texture ((200) Ag plane) was found to be 6.4° FWHM (FIG. 16) and the in-plane texture ((220) Ag plane) is determined to be 10.7° FWHM (FIG. 17). These detailed X-ray examinations confirm that rolling of Ag buffer do not alter the cube-on-cube biaxial alignment that is essential in the development of textured articles.

Following the surface modification step, selected ceramic buffers having demonstrated epitaxial relationship with the HTS of interest such as MgO, $CeO_2$ YSZ, $Y_2O_3$ or $RE_2O_3$ (e.g. $Yb_2O_3$) may be epitaxially deposited onto the textured article before subsequent HTS deposition.

EXAMPLE 3

Densification of HTS Precursor Deposited on Textured Article by Pressing

In the precursor approach to biaxially-textured HTS conductor fabrication, the precursor powder is heat treated at elevated temperatures in an oxidizing environment to enable HTS formation. Consequently, in order for a deformable metallic buffer to be useful, the deformed metallic buffer must not undergo recrystallization and accompanying changes in texture during subsequent heat treatment. To demonstrate this compliance, the pressed Ag/Pd/CeO$_2$/Ni sample detailed in Example 1 is heated to about 350° C. at a rate of approximately 10° C./min in a 7.5% O$_2$ and 92.5% Ar gas mixture. After holding at about 350° C. for approximately 1 hour, the sample is heated to about 825° C. at a rate of approximately 100° C./h. The sample is held at this temperature for approximately 2 hours before it is furnace cooled to room temperature. The 7.5% O$_2$ and 92.5% Ar oxidizing environment is maintained throughout the entire heat treatment.

Figure 18:
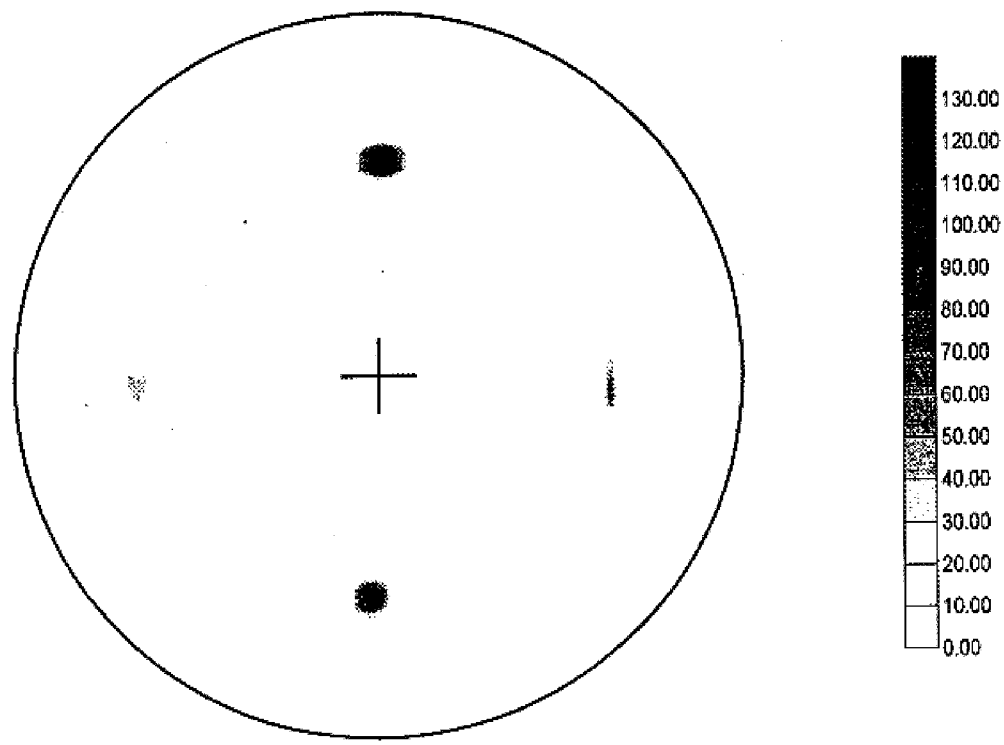
FIG. 18 is a (111) Ag pole figure of the sample shown in FIG. 8 after uniaxial pressing and annealing.
Figure 19:
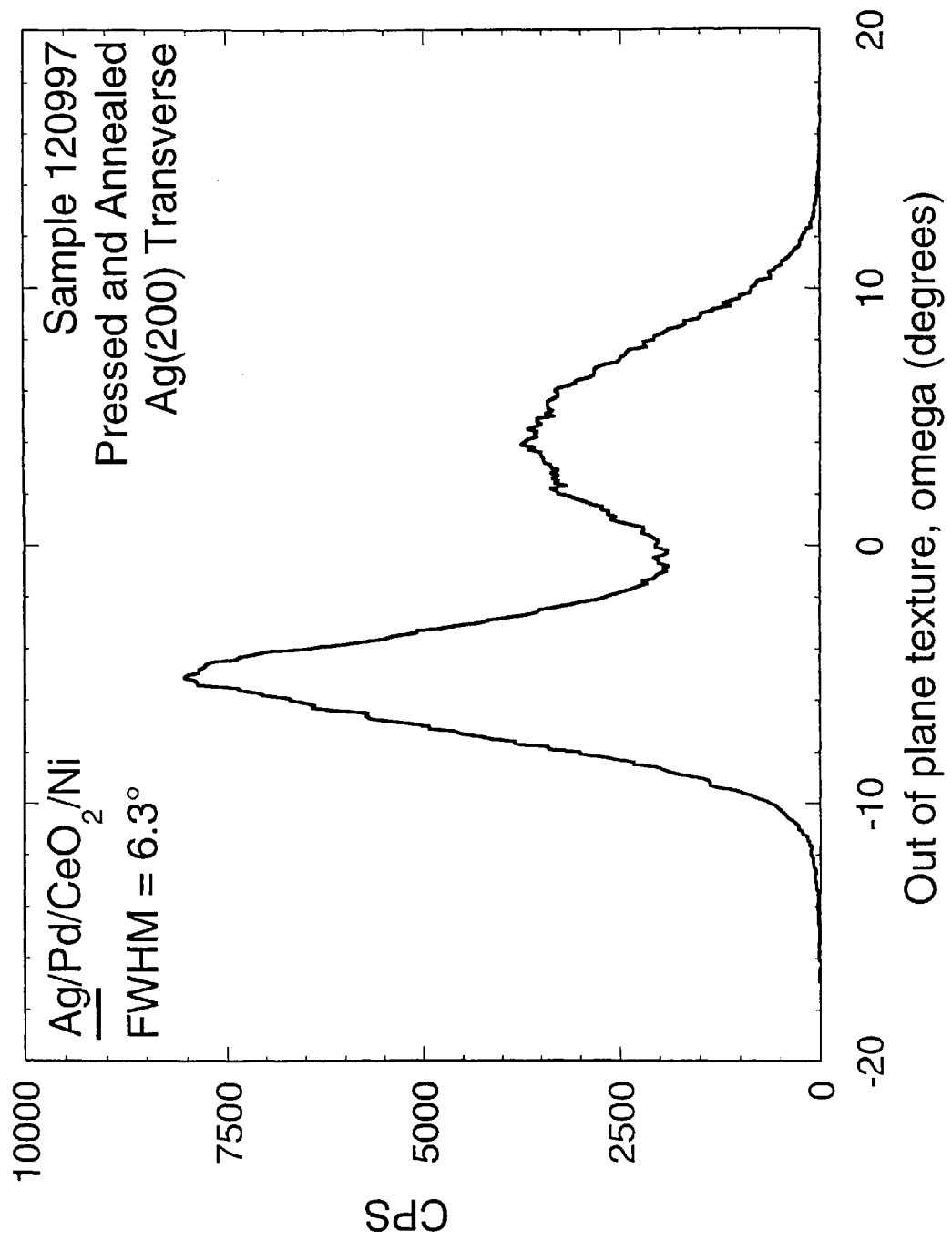
FIG. 19 is a transverse x-ray diffraction omega scan showing the out-of-plane texture of the (200) Ag plane on the pressed and annealed sample shown in FIG. 18 with an omega scan of 6.3° FWHM.
Figure 20:
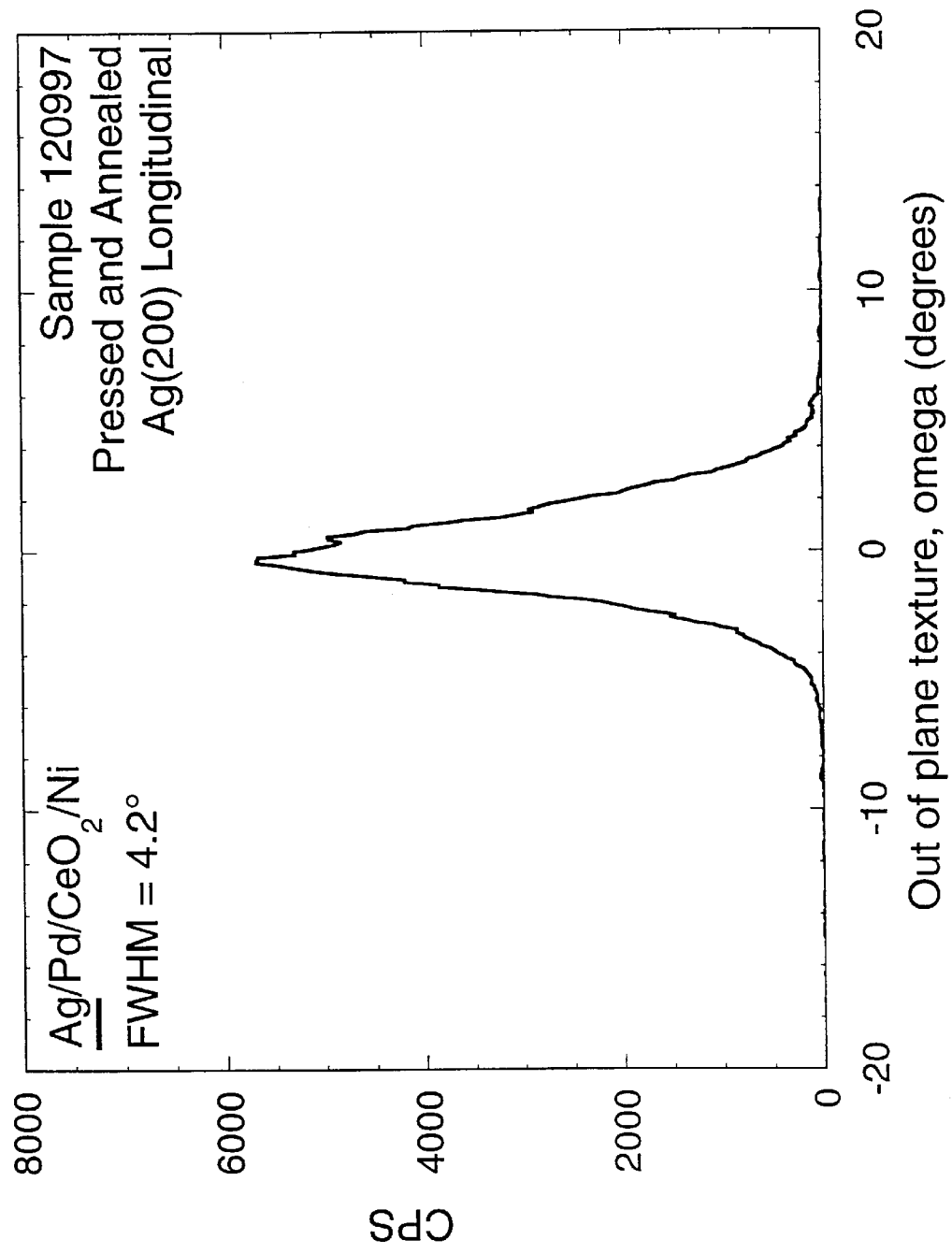
FIG. 20 is a longitudinal x-ray diffraction omega scan showing the out-of-plane texture of the (200) Ag plane on the pressed and annealed sample shown in FIG. 18 with an omega scan peak of 4.2° FWHM.
Figure 21:
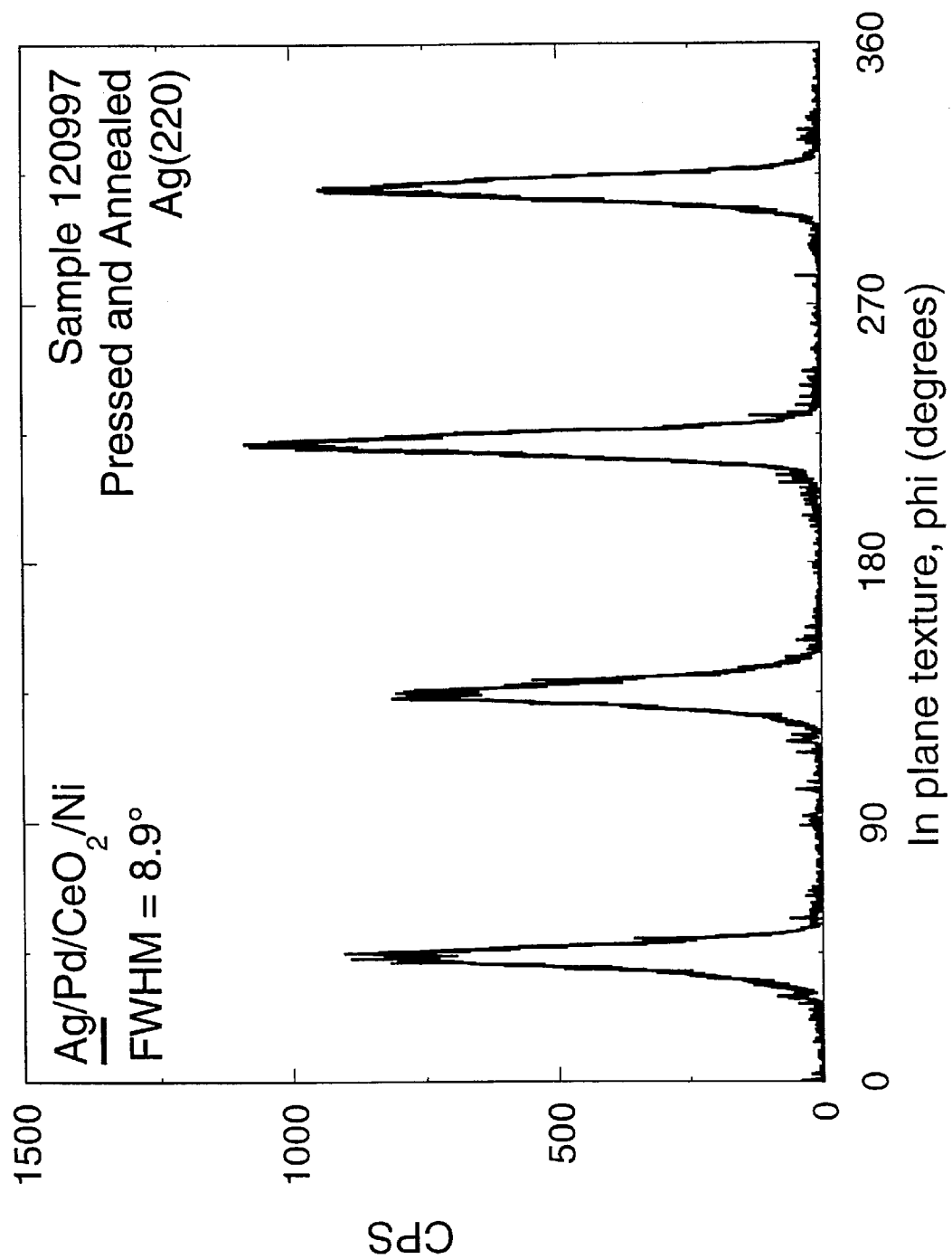
FIG. 21 is a x-ray diffraction phi scan showing the in-plane texture of the (220) Ag plane on the pressed and annealed sample shown in FIG. 18 with a phi scan peak of 8.9° FWHM.

FIG. 18 shows the (111) Ag pole figure of the pressed and annealed sample which is identical to those of the as-pressed as well as the as-sputtered stages. This result indicates that the Ag buffer did not recrystallize and the biaxial texture is not altered. The out-of-plane texture ((200) Ag plane) is determined to be 6.3° FWHM with splitting in the intensity peak due to minor grain rotation in the direction perpendicular to sample axis (FIG. 19) as previously found in the pressed sample. This peak splitting is absent along the sample axis and an out-of-plane texture ((200) Ag plane) was found to be 4.2° FWHM (FIG. 20). In addition, the in-plane texture of the pressed and annealed Ag buffer ((220) Ag plane) is determined to be 8.9° FWHM as shown in FIG. 21. These detailed X-ray examinations confirmed that pressing and annealing of Ag buffer do not alter the cube-on-cube biaxial alignment that is essential in the densification of HTS precursor to fabricate biaxially-textured HTS films.

To fabricate biaxially-textured HTS using the precursor approach, Ag buffer can be epitaxially deposited onto textured RABiTS as detailed in Example 1. The Ag buffer may be deformed at this stage if surface modification is required. Selected ceramic buffers having demonstrated epitaxial relationship with the HTS of interest such as MgO. CeO$_2$, YSZ, Y$_7$O$_3$ or RE$_2$O$_3$ (e.g. Yb$_2$O$_3$) may be epitaxially deposited onto the textured Ag buffer surface. HTS precursor will then be deposited onto the textured article by methods such as powder deposition and precursor solution approaches. After the required heated treatments to convert the precursor into its powder form, the sample is uniaxially pressed to densify the precursor. Following precursor densification, the sample is heat treated at appropriate temperatures in an oxidizing environment to enable the formation of biaxially textured HTS.

EXAMPLE 4

Densification of HTS Precursor Deposited on Textured Article by Rolling

To demonstrate that rolling and annealing does not alter the biaxial texture of Ag buffer, a unique feature that is required in the densification of HTS precursor on textured articles, the rolled Ag/Pd/CeO$_2$/Ni sample detailed in Example 2 is heated to about 350° C. at a rate of approximately 10° C./min in a 7.5% O$_2$ and 92.5% Ar gas mixture. After holding at about 350° C. for approximately 1 hour, the sample is heated to about 825° C. at a rate of approximately 100° C./h. The sample is held at this temperature for approximately 2 hours before being furnace cooled to room temperature. The 7.5% O$_2$ and 92.5% Ar oxidizing environment is maintained throughout the entire heat treatment.

Figure 22:
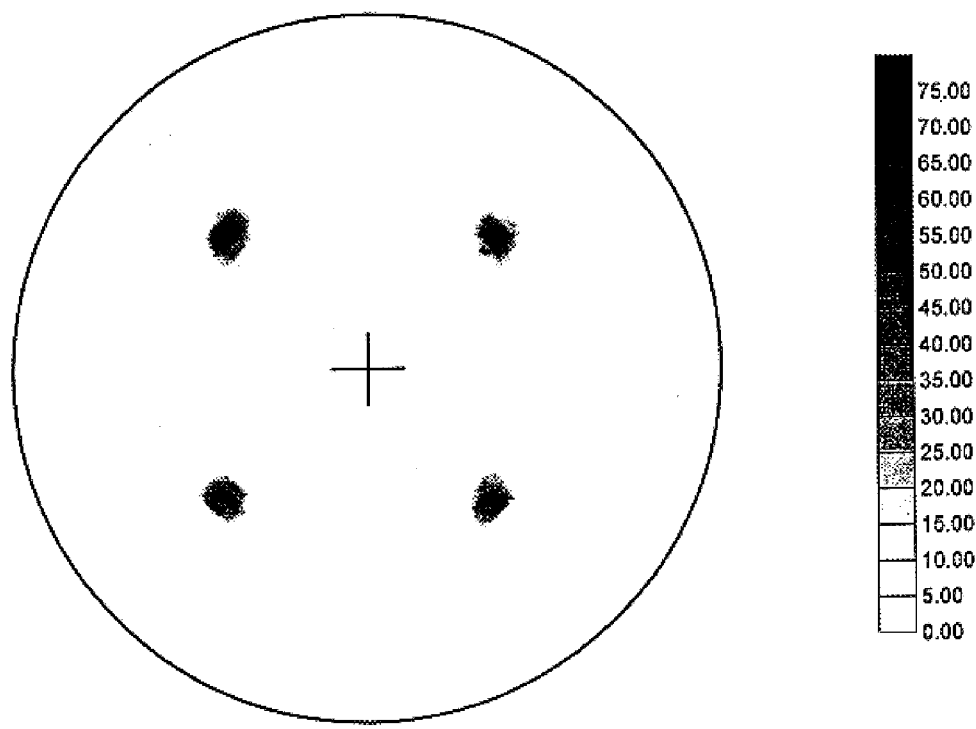
FIG. 22 is a (220) Ag pole figure of the sample shown in FIG. 14 after rolling and annealing.
Figure 23:
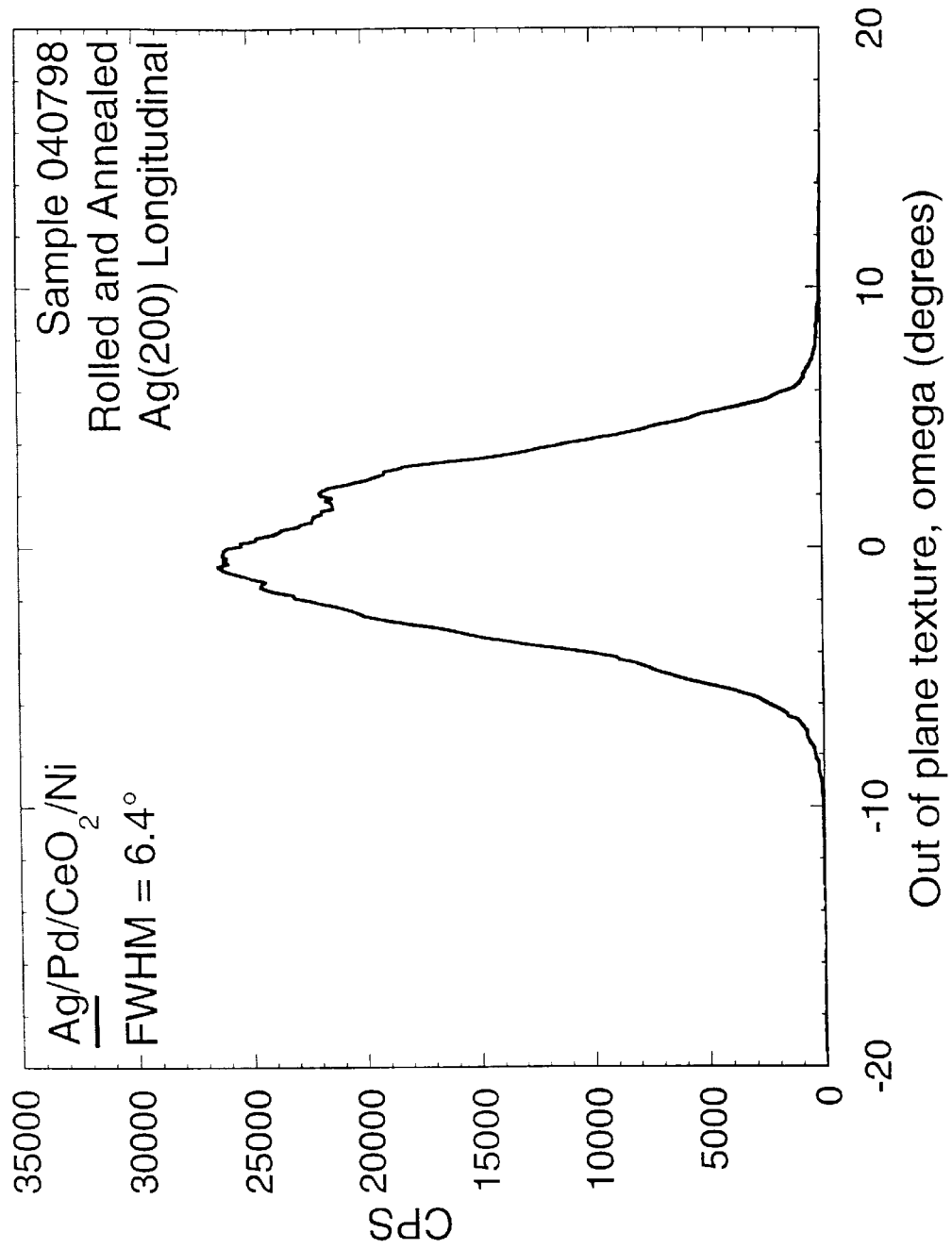
FIG. 23 is a longitudinal x-ray diffraction omega scan showing the out-of-plane texture of the (200) Ag plane on the rolled and annealed sample shown in FIG. 22 with an omega scan peak of 6.4° FWHM.
Figure 24:
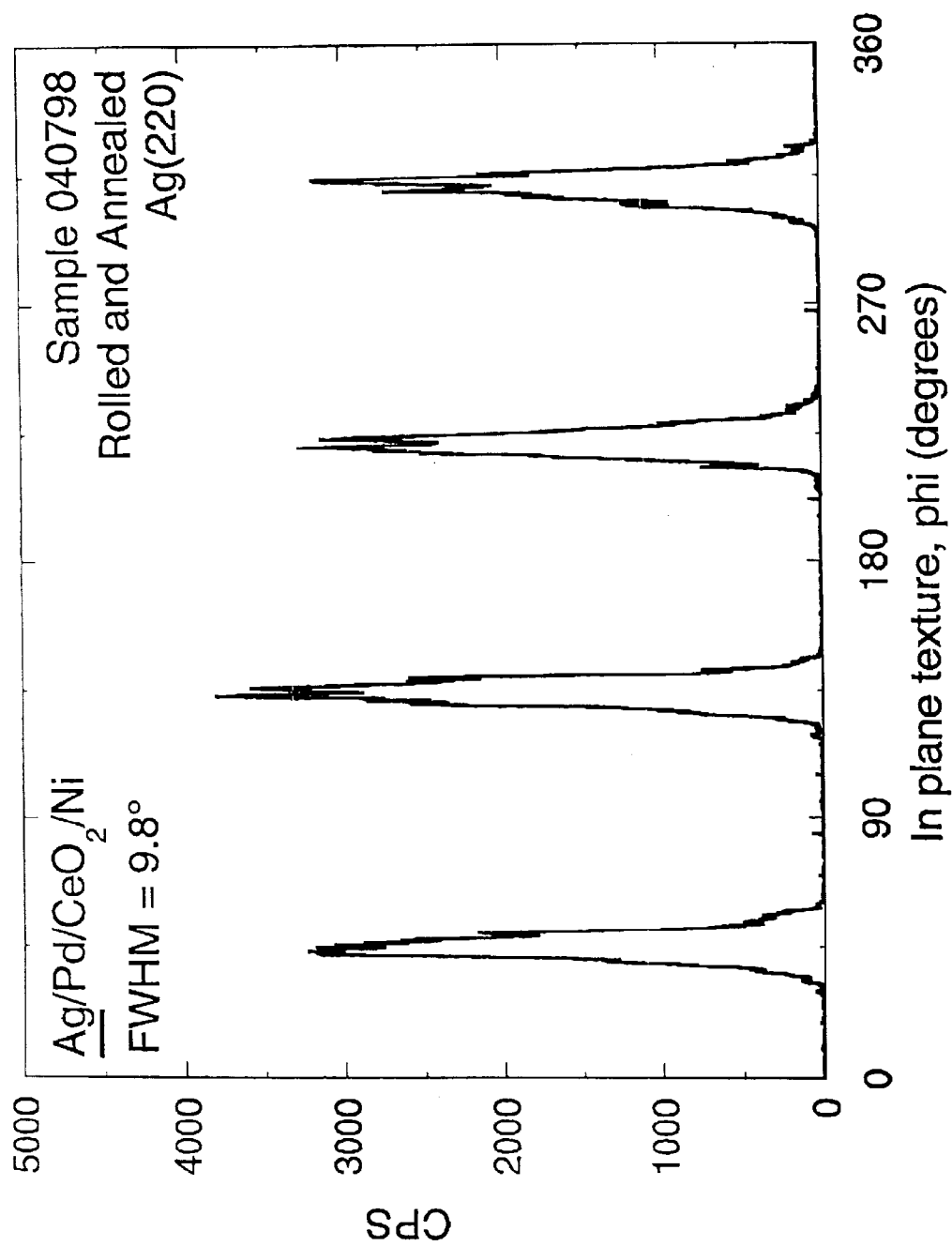
FIG. 24 is a x-ray diffraction phi scan showing the in-plane texture of the (220) Ag plane on the rolled and annealed sample shown in FIG. 22 with a phi scan peak of 9.8° FWHM.

FIG. 22 shows the (220) Ag pole figure of the rolled and annealed sample which is identical to those of the as-rolled as well as the as-sputtered stages. This result indicates that the Ag buffer did not recrystallize and the biaxial texture is not altered. The out-of-plane texture of the Ag buffer ((200) Ag plane) is determined to be 6.4° FWHM (FIG. 23) and the in-plane texture ((220) Ag plane) is determined to be 9.8° FWHM as shown in FIG. 24. These detailed X-ray examinations confirmed that rolling and annealing of Ag buffer does not alter the cube-on-cube biaxial alignment that is essential in the densification of HTS precursor to fabricate biaxially-textured HTS films.

To fabricate biaxially-textured HTS using the precursor approach, Ag buffer can be epitaxially deposited onto textured RABiTS as detailed in Example 1. The Ag buffer may be deformed at this stage if surface modification is required. Selected ceramic buffers having demonstrated epitaxial relationship with the HTS of interest such as MgO, CeO$_2$, YSZ, Y$_2$O$_3$ or RE$_2$O$_3$ (e.g. Yb$_2$O$_3$) may be epitaxially deposited onto the textured article. HTS precursor will then be deposited onto the textured article by methods such as powder deposition and precursor solution approaches. After the required heated treatments to convert the precursor into its powder form, the sample is rolled to densify the precursor. Following precursor densification, the sample is heat treated at appropriate temperatures and oxidizing environment to enable the formation of biaxially textured HTS.

While there has been shown and described what are at present considered the preferred embodiment of the invention, it will be obvious to those skilled in the art that various changes and modifications can be made therein without departing from the scope of the invention defined by the appended claims.

We claim:

1. A method of preparing a smoothed biaxially textured buffer layer on a biaxially textured article having a surface roughness, said method comprising the steps of:

depositing an epitaxial layer of a ductile buffer on a biaxially textured article, wherein said buffer acquires a biaxial texture from said biaxially textured article and has a surface roughness; and deforming said buffer to reduce said buffer surface roughness, wherein said ductile buffer retains said biaxial texture.

2. A method in accordance with claim 1, wherein said ductile buffer is a metal or alloy thereof.

3. A method in accordance with claim 2, wherein said metal or alloy thereof has a structure selected from the group consisting of a face-centered cube, body-centered cube and hexagonal close-packed crystalline.

4. A method in accordance with claim 2, wherein said metal is Ag or an alloy thereof.

5. A method in accordance with claim 1, wherein said biaxially textured article is a base metal substrate.

6. A method in accordance with claim 1, wherein said biaxially textured article is a laminate.

7. A method in accordance with claim 1, wherein said ductile buffer is deformed by pressing said biaxially textured article having said epitaxial layer of said buffer between two smooth surfaces.

8. A method in accordance with claim 7, wherein said smooth surfaces are polished rolls.

9. A method in accordance with claim 7, wherein said smooth surfaces are polished platens.

10. A method in accordance with claim 1, wherein said epitaxial layer is deformed to a surface roughness of not more than said biaxially textured surface roughness.

11. A method in accordance with claim 1, wherein said epitaxial layer upon deformation is characterized by a x-ray diffraction omega scan peak of no more than 10° FWHM out of plane texture which is no more than an x-ray diffraction omega scan peak of said biaxially textured substrate.

12. A method in accordance with claim 1, further comprising the step of annealing said epitaxially deposited ductile buffer.

13. A method in accordance with claim 1, further comprising the step of depositing one or more epitaxial layers of at least one other material on a surface of said deformed ductile buffer.

14. A method in accordance with claim 13, wherein said other material is selected from the group consisting of another buffer, a superconductor, photovoltaic, ferroelectric, optical material, and precursor thereof.

15. A method in accordance with claim 1, further comprising the step of depositing one or more epitaxial layers of at least one other material on said ductile buffer before deforming said ductile buffer.

16. A method in accordance with claim 15, wherein said other material is selected from the group consisting of another buffer, a superconductor, photovoltaic, ferroelectric, optical material, and precursor thereof.

17. A method in accordance with claim 16, wherein said another buffer is selected from the group consisting of $CeO_2$, MgO, YSC, $SrTiO_3$, $LaAlO_3$, and $RE_2O_3$.

18. A method of preparing a biaxially textured buffer layer on a surface having a surface roughness comprising the steps of:
 depositing an epitaxial layer of a buffer on a biaxially textured surface, wherein said buffer acquires a biaxial texture from said biaxially textured surface;
 depositing a high temperature superconductor precursor on a surface of said epitaxial layer; and
 densifying said high temperature superconductor precursor by mechanical deformation while maintaining said biaxial texture of said epitaxial layer.

19. A method in accordance with claim 18, wherein said buffer is a metal or alloy thereof having a structure selected from the group consisting of a face-centered cube, body-centered cube and hexagonal close-packed crystalline.

20. A method in accordance with claim 18, wherein said buffer is Ag or an alloy thereof.

21. A method in accordance with claim 18, wherein said biaxially textured surface is a surface of a base metal substrate.

22. A method in accordance with claim 18, wherein said biaxially textured surface is a surface of a top layer of a laminate article.

23. A method in accordance with claim 22, wherein said laminate article is a base metal substrate having at least one layer on top of said substrate.

24. A method in accordance with claim 22, wherein said mechanical deformation is pressing said laminate article between two smooth surfaces.

25. A method in accordance with claim 24, wherein said smooth surfaces are polished rolls.

26. A method in accordance with claim 24, wherein said smooth surfaces are polished platens.

27. A method in accordance with claim 18, further comprising the step of depositing one or more epitaxial layers at least one other material on said buffer before depositing a high temperature superconductor precursor.

28. A method in accordance with claim 18, further comprising the step of annealing said epitaxially deposited ductile buffer.

* * * * *